(12) United States Patent
Amano et al.

(10) Patent No.: US 8,188,600 B2
(45) Date of Patent: May 29, 2012

(54) SEMICONDUCTOR DEVICE AND METHOD OF FABRICATING THE SAME

(75) Inventors: Mari Amano, Tokyo (JP); Munehiro Tada, Tokyo (JP); Yoshihiro Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 928 days.

(21) Appl. No.: 11/571,251

(22) PCT Filed: Jun. 24, 2005

(86) PCT No.: PCT/JP2005/011578
§ 371 (c)(1),
(2), (4) Date: Dec. 22, 2006

(87) PCT Pub. No.: WO2006/001356
PCT Pub. Date: Jan. 5, 2006

(65) Prior Publication Data
US 2008/0054470 A1   Mar. 6, 2008

(30) Foreign Application Priority Data
Jun. 24, 2004   (JP) ................................. 2004-187044

(51) Int. Cl.
*H01L 23/522* (2006.01)
(52) U.S. Cl. ........ 257/753; 257/762; 257/765; 257/767; 257/E23.161
(58) Field of Classification Search .......... 257/751–753, 257/767, 762, 771, 763–765
See application file for complete search history.

(56) References Cited

U.S. PATENT DOCUMENTS

| | | | | |
|---|---|---|---|---|
| 5,913,147 A * | 6/1999 | Dubin et al. | ................... | 438/687 |
| 6,107,687 A * | 8/2000 | Fukada et al. | ................. | 257/762 |
| 6,309,959 B1 * | 10/2001 | Wang et al. | ................... | 438/625 |
| 6,387,806 B1 * | 5/2002 | Wang et al. | ................... | 438/687 |
| 6,664,185 B1 * | 12/2003 | Wang et al. | ................... | 438/659 |
| 6,764,951 B1 * | 7/2004 | van Ngo | ....................... | 438/687 |
| 6,962,870 B2 * | 11/2005 | Masuda et al. | ................ | 438/624 |

(Continued)

FOREIGN PATENT DOCUMENTS

EP            601509 A1 *   6/1994
(Continued)

OTHER PUBLICATIONS

Awaya et al., "Self-Aligned Passivation Technology for Copper Interconnection", Jpn. J. Appl. Phys. vol. 36, 1997, 1548-1553.*

(Continued)

*Primary Examiner* — Jerome Jackson, Jr.
*Assistant Examiner* — Yu Chen
(74) *Attorney, Agent, or Firm* — Dickstein Shapiro LLP

(57) ABSTRACT

The present invention provides a semiconductor device which is capable of enhancing adhesion at an interface between a wire-protection film and copper, suppressing dispersion of copper at the interface to avoid electromigration and stress-inducing voids, and having a highly reliable wire. An interlayer insulating film, and a first etching-stopper film are formed on a semiconductor substrate on which a semiconductor device is fabricated. A first alloy-wire covered with a first barrier metal film is formed on the first etching-stopper film by a damascene process. The first alloy-wire is covered at an upper surface thereof with a first wire-protection film. The first wire-protection film covering an upper surface of the first alloy-wire contains at least one metal among metals contained in the first alloy-wire.

16 Claims, 22 Drawing Sheets

U.S. PATENT DOCUMENTS

| | | |
|---|---|---|
| 2002/0076925 A1* | 6/2002 | Marieb et al. ............... 438/678 |
| 2003/0134499 A1* | 7/2003 | Chen et al. .................. 438/618 |
| 2004/0004289 A1* | 1/2004 | Ueno ........................... 257/762 |

FOREIGN PATENT DOCUMENTS

| | | |
|---|---|---|
| JP | 6-177128 | 6/1994 |
| JP | 9-289214 | 11/1997 |
| JP | 11-204524 | 7/1999 |
| JP | 2001-319928 | 11/2001 |
| JP | 2002-75995 | 3/2002 |
| JP | 2002-134610 | 5/2002 |
| JP | 2003-142579 | 5/2003 |
| JP | 2003-152076 | 5/2003 |
| JP | 2003-257979 | 9/2003 |
| JP | 2004-6748 | 1/2004 |
| JP | 2004-39916 | 2/2004 |
| JP | 2004-47846 | 2/2004 |
| JP | 2004-95865 | 3/2004 |

OTHER PUBLICATIONS

Ogawa et al., "Stress-Induced Voiding Under Vias Connected to Wide Cu Metal Leads", IEEE International Reliability Physics Symposium Proceedings, pp. 312-321 (2002).

Yoshida et al., "Stress-Induced Voiding Phenomena for an actual CMOS LSI Interconnects", IEEE International Electron Device Meeting, pp. 753-756 (2002).

* cited by examiner

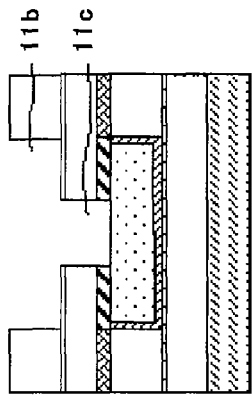
FIG.7A
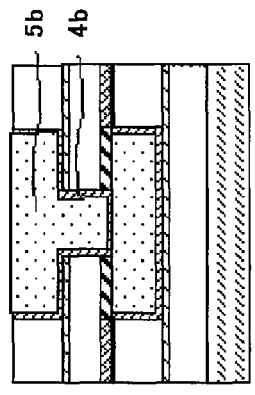
FIG.7B
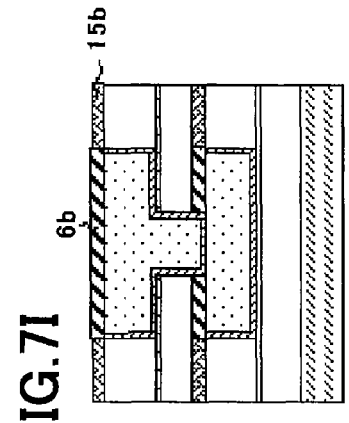
FIG.7C
FIG.7D
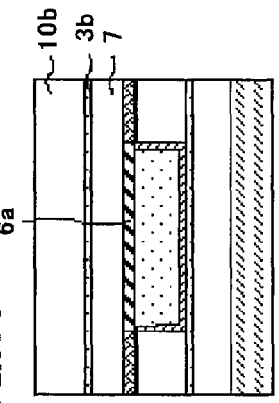
FIG.7E
FIG.7F
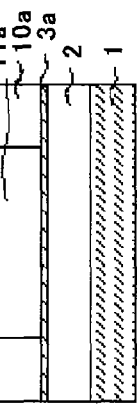
FIG.7G
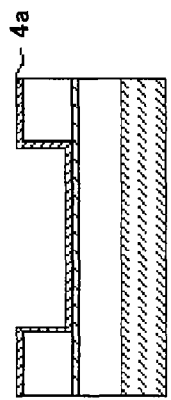
FIG.7H
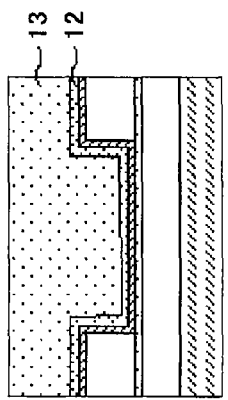
FIG.7I

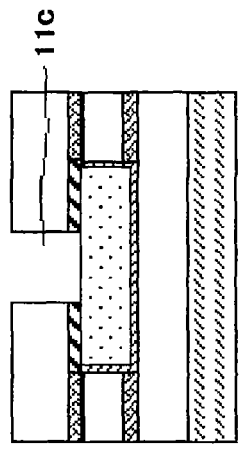
FIG.14A
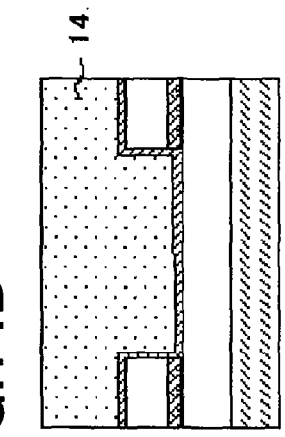
FIG.14D
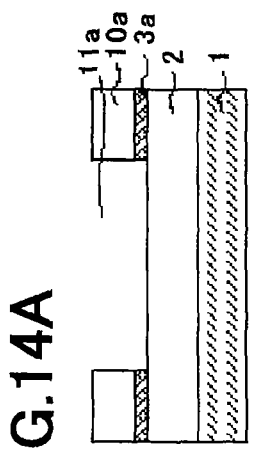
FIG.14G
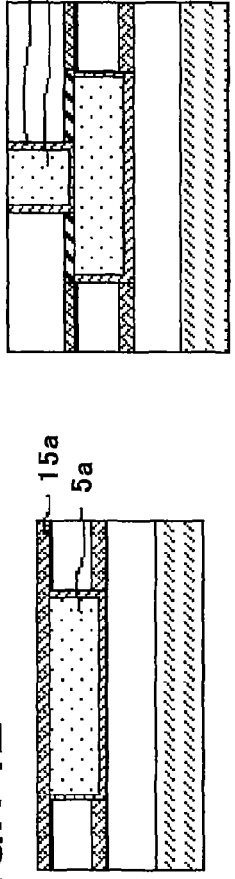
FIG.14B
FIG.14E
FIG.14H
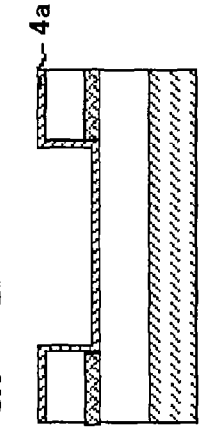
FIG.14C
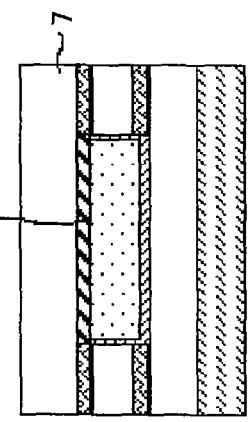
FIG.14F
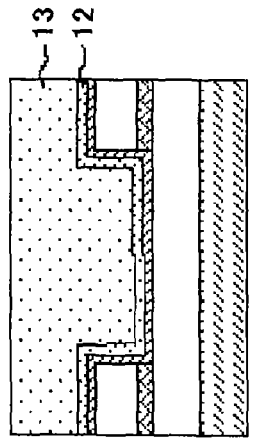
FIG.14I

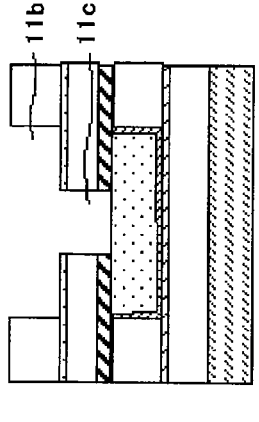
FIG.18A
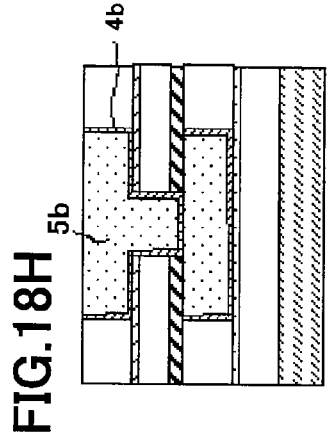
FIG.18D
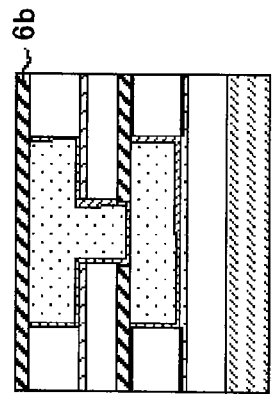
FIG.18G
FIG.18B
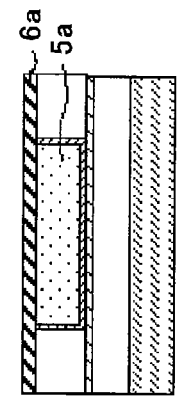
FIG.18E
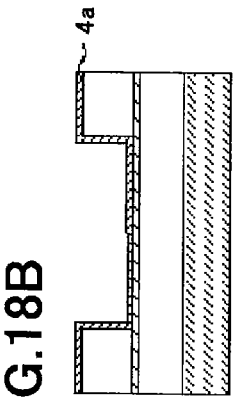
FIG.18H
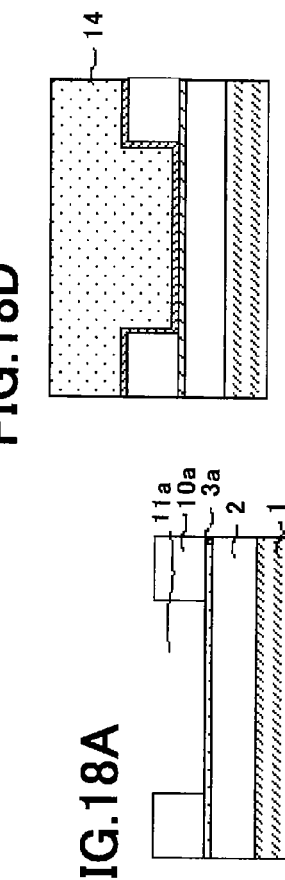
FIG.18C
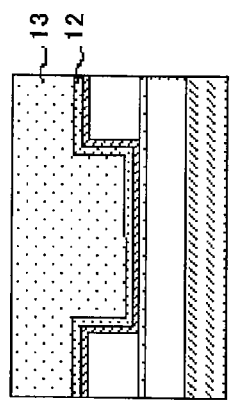
FIG.18I

SEMICONDUCTOR DEVICE AND METHOD OF FABRICATING THE SAME

BACKGROUND OF THE INVENTION

1. Field of the Invention

The present invention relates to a semiconductor device having a wired-structure, and more particularly to a semiconductor device having a trench-wire (damascene wire) structure containing copper as a principal constituent, and a method of fabricating the same.

2. Description of the Related Art

An electrically conductive wire in a silicon semiconductor integrated circuit (LSI) has been conventionally composed of aluminum (Al) or aluminum (Al) alloy. However, as a wire dimension has became smaller and smaller in recent LSIs, copper is often used as a material of which an electrically conductive wire is composed, in place of aluminum (Al) and aluminum (Al) alloy, in order to reduce a resistance of a wire and enhance reliability.

As a wire dimension is further reduced with recent reduction in a size of LSI, there is caused a problem that migration in a copper wire readily occurs. In particular, a problem of electromigration and stress-inducing voids, that is, a phenomenon in which a void or voids is(are) generated at a location at which a via and a wire are electrically connected to each other, is quite serious.

Electromigration is grouped into two types.

In the first type of electromigration, a void is generated, in a structure in which a lower wire and an upper wire are electrically connected to each other through a via, in the lower wire in the vicinity of a location at which the lower wire and the via are electrically connected to each other.

FIGS. 22A and 22B are cross-sectional views of a wire having defectiveness generated due to electromigration. FIG. 22A is a cross-sectional view illustrating the first type of electromigration.

As illustrated in FIG. 22A, a lower wire 100, a wire-protection film 101, an upper wire 102, and a wire-protection film 103 are formed in this order in a multi-layered structure. The lower wire 100 and the upper wire 102 are electrically connected to each other through a via 104. A void 105 is generated in the lower wire 100 in the vicinity of a location at which the lower wire 100 and the via 104 are connected to each other.

In the second type of electromigration, a void is generated, in a structure in which a lower wire and an upper wire are electrically connected to each other through a via, in the upper wire at an interface between the upper wire and a wire-protection film.

FIG. 22B is a cross-sectional view illustrating the second type of electromigration.

As illustrated in FIG. 22B, a void 106 is generated in the upper wire 1-2 at an interface between the upper wire 102 and the wire-protection film 103.

As illustrated in FIG. 22A, the first type of electromigration is generated when electrons 110 flow into the lower wire 100 from the upper wire 102. The void 105 is generated in the lower wire 100 both in the vicinity of a location at which the lower wire 100 and the via 104 are connected to each other and into which the electrons flow, and at an interface between the lower wire 100 and the wire-protection film 101.

As illustrated in FIG. 22B, the second type of electromigration is generated when electrons 110 flow into the upper wire 102 from the lower wire 100. The void 106 is generated in the upper wire 102 at an interface between the upper wire 102 and the wire-protection film 103.

This is because copper migration is likely to be generated at an interface between the wire-protection films 101, 103 and copper of which the lower wire 100 or the upper wire 102 is composed.

FIG. 23 is a cross-sectional view illustrating a stress-inducing void generated in a damascene wire.

As illustrated in FIG. 23, a lower wire 120, a wire-protection film 121, an interlayer insulating film 122, a wire-protection film 123, an upper wire 124 and a wire-protection film 125 are formed in this order as a multi-layered structure. The lower wire 120 and the upper wire 123 are electrically connected to each other through a via 127 formed throughout the interlayer insulating film 122.

As illustrated in FIG. 23, a stress-inducing void 126 may be generated in a damascene wire in a relatively broad area within the lower wire 120 with which the via 127 makes contact at a bottom thereof.

The mechanism of generation of such a stress-inducing void 126 is explained by the model that holes generated in the upper wire 123 or the lower wire 120 both composed of copper gather to a location at which the via 127 and the lower wire 120 are connected to each other and at which a stress is concentrated most significantly within the wire, through a dispersion path comprised of an interface between the lower wire 120 and the wire-protection film 121 or grain boundary, and then, define the void 126 for relaxing the stress (Non-patent reference 1, p. 318, FIG. 9).

There have been suggested processes for preventing dispersion of copper at an interface between a wire and a wire-protection film, and/or dispersion of holes generated in a copper wire, both of which cause electromigration and stress-inducing voids.

The first process is to increase a number of vias through which wires are electrically connected to each other (multi-via).

By increasing a number of vias through which wires are electrically connected to each other, it is possible to reduce a current density in each of vias, resulting in enhancement of resistance to electromigration.

With respect to a stress-inducing void, it is reported that a multi-via structure relaxes a stress to thereby enhance a resistance. For instance, the Non-patent reference 2 reports so.

The second process is to turn copper of which a wire is composed, into copper alloy to thereby enhance a resistance of copper to migration.

The patent reference 1 suggests copper alloy comprised of copper to which silver is added. As a process of fabricating a copper alloy film, there are suggested a sputtering process in which a target comprised of copper/silver alloy is used, a process of fabricating alloy by plating copper with tin or chromium, and CVD (Chemical Vapor Deposition).

The third process is to enhance adhesion in an interface between a wire and a wire-protection film.

The patent reference 2 suggests using an electrically conductive film as a wire-protection film. Specifically, it is said to be possible to prevent generation of electromigration or stress migration by causing an electrically conductive wire-protection film such as a tungsten film to selectively or preferentially grow on a wire.

Patent Reference 1: Japanese Patent Application Publication No. 9-289214

Patent Reference 2: Japanese Patent Application Publication No. 2001-319928

Non-patent Reference 1: E. T. Ogawa, et al., IEEE International Reliability Physics Symposium Proceedings, 2002, pp. 312-321

Non-patent Reference 2: K. YOSHIDA, et al., IEEE International Electron Device Meeting, 2002, pp. 753-756

Apart from the above-mentioned patent and non-patent references, Japanese Patent Application Publication No. 2002-134610 has suggested a method of fabricating a semiconductor device including the steps of forming a first electrically insulating film on a semiconductor substrate, forming a first wire layer in the first electrically insulating film, forming a second electrically insulating film by sputtering on both the first electrically insulating film and the first wire layer, forming a third electrically insulating film on the second electrically insulating film, and forming a second wire layer in the third electrically insulating film such that the first and second wire layers are electrically connected to each other, the second electrically insulating film suppressing constituents of the first wire layer from dispersing into the third electrically insulating film.

Japanese Patent Application Publication No. 2003-142579 has suggested a method of fabricating a semiconductor device including the steps of (a) forming a wire opening in a first electrically insulating film formed on a wafer, (b) forming a wire in the wire opening, the wire being comprised of a first electrically conductive film having barrier characteristic against dispersion of copper, and a second electrically conductive film containing copper as a principal constituent, and (c) after forming a second electrically insulating film on the first electrically insulating film and a wire for protecting the first electrically conductive film from being oxidized, forming a third electrically insulating film on the second electrically insulating film by chemical vapor deposition in which gas containing oxygen is used.

Japanese Patent Application Publication No. 2003-152076 has suggested a semiconductor device including an interlayer insulating film, an electrically conductive film containing copper as a principal constituent, and a silicon carbide film, wherein the silicon carbide film is sandwiched between the electrically conductive film and the interlayer insulating film, and the silicon carbide film contains oxygen atoms at 30 at. % or more.

Japanese Patent Application Publication No. 2004-6748 has suggested an integrated circuit formed on a horizontal surface of a semiconductor body, including a dielectric layer formed on the semiconductor body, a substantially vertical hole passing through the dielectric layer and having a sidewall and a bottom, a barrier layer covering therewith the dielectric layer having the sidewall and the bottom of the hole for sealing copper, and a transition layer covering the barrier layer therewith and containing copper therein, the transition layer having higher resistivity than that of pure copper, and intensively being adhered to copper and the barrier layer to enhance a resistance to electromigration, copper being filled in the rest of the hole.

Japanese Patent Application Publication No. 2004-47846 has suggested a method of fabricating a metal wire, including the steps of forming a trench in an electrically insulating layer, forming a barrier layer on a surface of the electrically insulating layer including an inner surface of the trench, the barrier layer containing an additive, forming a metal seed layer on the barrier layer, forming a metal layer on the metal seed layer so as to bury the trench therewith, carrying out thermal annealing at a first temperature at which growth of crystal grains of the metal seed layer and the metal layer is facilitated, removing a part of the barrier layer, the metal seed layer and the metal layer such that an upper portion of the electrically insulating layer appears, to thereby form a metal wire comprised of portions of the metal seed layer and the metal layer remaining in the trench, and carrying out thermal annealing at a second temperature at which the additive contained in the barrier layer can be dispersed in the metal wire and which is higher than the first temperature.

Japanese Patent Application Publication No. 2004-95865 has suggested a semiconductor device including a semiconductor substrate, and an interlayer insulating film formed on the semiconductor substrate, wherein the interlayer insulating film has a multi-layered structure comprised of an adhesive film composed of silicon-containing compound containing aromatic ring in an atom, and a dielectric film making contact with the adhesive film and composed of organic dielectric material having a dielectric constant equal to or smaller than 4.

SUMMARY OF THE INVENTION

However, the above-mentioned prior art is accompanied with the following problems.

In the process (the above-mentioned first prior art) of varying a wire pattern or forming a multi-via to thereby reduce a current density in vias or reduce a stress inclination in a wire, a wire layout has to be restricted, resulting in that it is not possible to reduce a dimension in a chip size, and hence, not possible to reduce a chip area. Thus, the process is accompanied with a problem that it is quite difficult to accomplish both reliability and reduction in a chip size. Hence, there is a need for a semiconductor which is capable of maximizing an advantage of reducing a chip size, and which is not necessary to restrict a layout.

It is possible to enhance reliability to a wire, if the wire is composed of copper alloy including copper as a principal constituent and other additional metals, as taught in the above-mentioned second prior art. However, the second prior art is accompanied with a problem that if an amount of metal to be added to copper is too large, a resultant wire would have a high resistance, resulting in deterioration in high-speed performance of a circuit.

If an amount of metals to be added to copper is reduced in order to prevent a resistance of a wire from increasing, desired reliability to a wire might not be ensured. Thus, there is a need for a process which is applicable to a copper wire or a copper alloy wire without an increase in a wire resistance.

Since adhesion at an interface between copper and a wire-protection film is low in conventional wire and wire-protection film, copper atoms are likely to disperse at the interface or holes existing in copper are likely to disperse in the copper. Hence, it is difficult to have a highly reliable wire.

As suggested in the patent reference 2, the process (the above-mentioned third prior art) prevents dispersion of copper atoms by arranging an electrically conductive film having superior adhesion between a wire-protection film and copper. However, it is quite difficult to cause an electrically conductive film to selectively or preferentially grow only on a wire. Furthermore, if an electrically conductive film grows even slightly onto an interlayer insulating film, there is caused a problem of current leakage between wires. Accordingly, there is a need for a process of fabricating a semiconductor which enhances adhesion between copper and a wire-protection film without an increase in current leakage between wires, and prevents generation of voids at an interface between copper and a wire-protection film for enhancing reliability of a product.

It is an object of the present invention to provide a semiconductor device and a method of fabricating the same, both of which are capable of enhancing adhesion at an interface between a wire-protection film and copper, preventing copper dispersion at the interface to thereby prevent generation of electromigration and stress-inducing voids, and presenting highly reliable wires.

In order to accomplish the above-mentioned object, the present invention provides a semiconductor device including a wire composed of alloy, and a first wire-protection film covering an upper surface of the alloy wire therewith, wherein the first wire-protection film contains at least one of metal elements among metal elements contained in the alloy wire.

The present invention further provides a semiconductor device including a wire composed of alloy, a first wire-protection film covering an upper surface of the alloy wire therewith, and a second wire-protection film formed on the first wire-protection film, wherein that the first wire-protection film contains at least one of metal elements among metal elements contained in the alloy wire, and the second wire-protection film does not contain the at least one of metal elements.

It is preferable that the first wire-protection film is comprised of an electrically insulating film.

As metal elements to be contained in the alloy wire, one or more of aluminum, copper, tin, titanium, tungsten, silver, zirconium, indium and magnesium may be selected, for instance.

The present invention further provides a semiconductor device including a wire composed of alloy, and a first wire-protection film covering an upper surface of the alloy wire therewith, wherein the first wire-protection film contains at least one of metal elements among metal elements contained in the alloy wire, a concentration of metal elements other than a principal constituent of the alloy wire is higher in the vicinity of the first wire-protection film than in a central area of the alloy wire, and the alloy wire contains at least one of aluminum, copper, tin, titanium, tungsten, silver, zirconium, indium and magnesium.

It is preferable that the semiconductor device further includes a second wire-protection film formed on the first wire-protection film, in which case, the second wire-protection film dose not contain the at least one of metal elements.

It is preferable that the second wire-protection film is comprised of an electrically insulating film.

The alloy wire may contain copper as a principal constituent, for instance.

The semiconductor device may further include a barrier metal film covering the alloy wire therewith, in which case, a concentration of metal elements other than a principal constituent of the alloy wire is higher in the vicinity of both the first wire-protection film and the barrier metal film than in a central area of the alloy wire.

It is preferable that a concentration of metal elements other than a principal constituent of the alloy wire is smaller than 0.1 at. % in a central area of the alloy wire, and equal to or greater than 0.1 at. %, but equal to or smaller than 1.5 at. % in the vicinity of the first wire-protection film.

When the semiconductor device is designed to include a barrier metal film, it is preferable that a concentration of metal elements other than a principal constituent of the alloy wire is smaller than 0.1 at. % in a central area of the alloy wire, and equal to or greater than 0.1 at. %, but equal to or smaller than 1.5 at. % in the vicinity of both the first wire-protection film and the barrier metal film.

The first wire-protection film may be comprised of one of a SiN film, a SiC film, a SiCN film, a SiOC film, a SiOCH film, these films containing organic material, a film containing organic material as a principal constituent, and a film containing organic material as a principal constituent, and further containing SiO.

Similarly to the first wire-protection film, the second wire-protection film may be comprised of one of a SiN film, a SiC film, a SiCN film, a SiOC film, a SiOCH film, these films containing organic material, a film containing organic material as a principal constituent, and a film containing organic material as a principal constituent, and further containing SiO.

It is preferable that the metal elements in the first wire-protection film have a higher concentration at a location closer to the alloy wire.

For instance, the alloy wire may be comprised of a copper/aluminum alloy wire containing copper as a principal constituent, and further containing aluminum, and the first wire-protection film is comprised of a SiCN film containing copper and aluminum.

For instance, it is preferable that the alloy wire is comprised of a copper/aluminum alloy wire containing copper as a principal constituent, and further containing aluminum, and a concentration of the aluminum in the alloy wire is smaller than 0.1 at. % in a central area of the alloy wire, and equal to or greater than 0.1 at. %, but equal to or smaller than 1.5 at. % in the vicinity of both the first wire-protection film and the barrier metal film.

The present invention further provides a method of fabricating a semiconductor device, including forming a wire composed of alloy, and forming a first wire-protection film covering an upper surface of the alloy wire therewith, the first wire-protection film containing at least one of metal elements among metal elements contained in the alloy wire.

It is preferable that the method further includes forming a second wire-protection film on the first wire-protection film, the second wire-protection film not containing the at least one of metal elements.

The present invention further provides a method of fabricating a semiconductor device, including forming a wire composed of alloy, and forming a first wire-protection film covering an upper surface of the alloy wire therewith, wherein the alloy wire is formed such that a concentration of metal elements other than a principal constituent of the alloy wire is higher in the vicinity of the first wire-protection film than in a central area of the alloy wire.

It is preferable that the method further includes forming a barrier metal film covering the alloy wire therewith, wherein the alloy wire is formed such that a concentration of metal elements other than a principal constituent of the alloy wire is higher in the vicinity of both the first wire-protection film and the barrier metal film than in a central area of the alloy wire.

It is preferable that the alloy wire is formed such that a concentration of metal elements other than a principal constituent of the alloy wire is smaller than 0.1 at. % in a central area of the alloy wire, and equal to or greater than 0.1 at. %, but equal to or smaller than 1.5 at. % in the vicinity of the first wire-protection film.

When the semiconductor device is designed to include a barrier metal film, it is preferable that the alloy wire is formed such that a concentration of metal elements other than a principal constituent of the alloy wire is smaller than 0.1 at. % in a central area of the alloy wire, and equal to or greater than 0.1 at. %, but equal to or smaller than 1.5 at. % in the vicinity of both the first wire-protection film and the barrier metal film.

It is preferable that the first wire-protection film is formed such that the metal elements in the first wire-protection film have a higher concentration at a location closer to the alloy wire.

It is preferable that the alloy wire is formed as a copper/aluminum alloy wire containing copper as a principal constituent, and further containing aluminum, and the alloy wire is formed such that a concentration of the aluminum in the alloy wire is smaller than 0.1 at. % in a central area of the alloy wire, and equal to or greater than 0.1 at. %, but equal to or smaller than 1.5 at. % in the vicinity of both the first wire-protection film and the barrier metal film.

The inventors discovered that if at least one of the following requirements is satisfied, it would be possible to enhance adhesion between an alloy wire and a wire-protection film, and prevent both dispersion of metals in an alloy wire and dispersion of holes existing in the metals to thereby enhance reliability to an alloy wire.

(1) a wire-protection film is designed to contain at least one of metals among metals contained in an alloy wire.

(2) an adhesion layer is formed between an alloy wire and a wire-protection film, the adhesion layer being comprised of at least one of metals among metals contained in the alloy wire, and the wire-protection film.

(3) a concentration of metals other than a principal constituent of an alloy wire is set higher in the vicinity of a wire-protection film than in a central area of the alloy wire.

The present invention is based on the above-mentioned discovery.

The present invention makes it possible to enhance adhesion between a wire and a wire-protection film in a semiconductor device, and enhance a resistance to both electromigration and stress-inducing voids.

BRIEF DESCRIPTION OF THE DRAWINGS

FIGS. 7A to 7I are cross-sectional views of the semiconductor device in accordance with the first embodiment of the present invention, each illustrating a step in the method of fabricating the semiconductor device.

FIGS. 14A to 14I are cross-sectional views of the semiconductor device in accordance with the third embodiment of the present invention, each illustrating a step in the method of fabricating the semiconductor device.

FIGS. 18A to 18I are cross-sectional views of the semiconductor device in accordance with the first embodiment of the present invention, each illustrating a step in the method of fabricating the semiconductor device.

DESCRIPTION OF THE PREFERRED EMBODIMENTS

Figure 1:
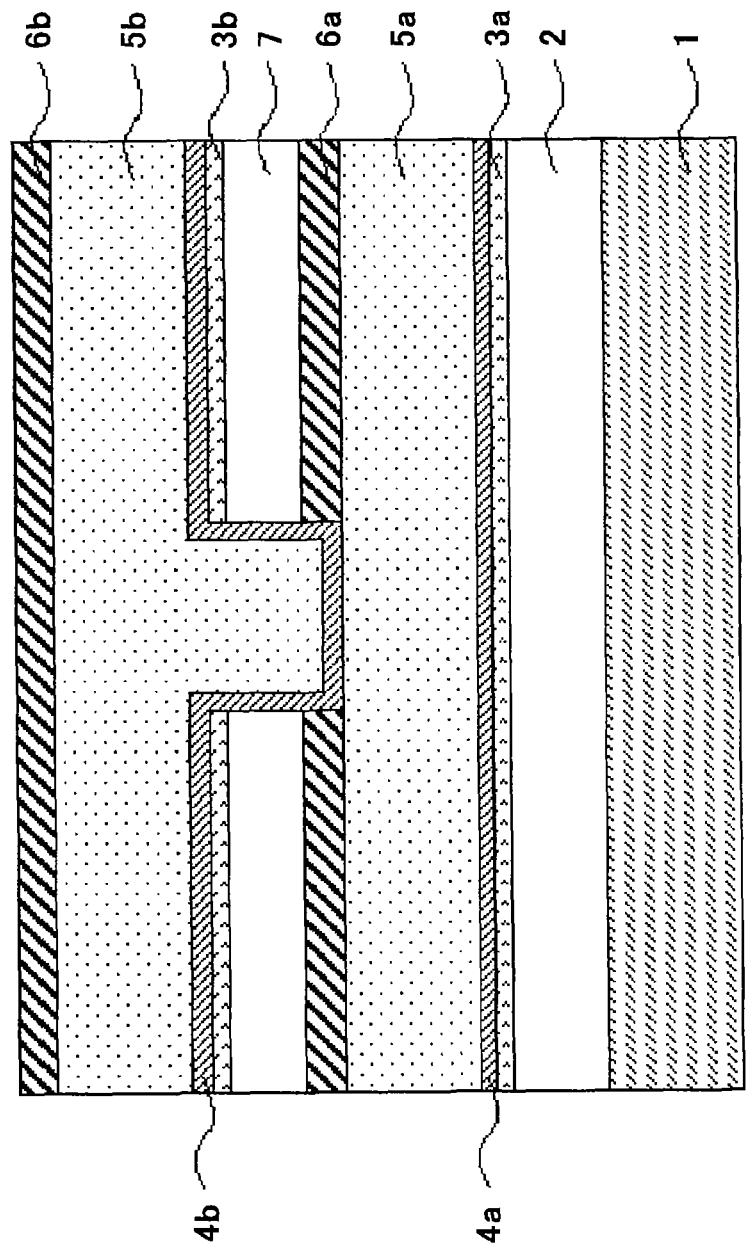
FIG. 1 is a cross-sectional view illustrating a semiconductor device in accordance with the first embodiment of the present invention.

Before the embodiments in accordance with the present invention are explained, meaning of the terms used in the specification is explained.

In the specification, alloy means a metal including a principal metal element and a non-principal metal element(s). Alloy indicates only metals including a principal metal element and other metal element(s) intentionally added thereto. A metal including impurity unavoidably added thereto is not alloy.

For instance, the expression "copper alloy" means that a principal constituent thereof is copper, and metal element(s) other than copper is(are) added thereto.

For instance, the expression "copper/aluminum alloy" means that a principal constituent thereof is copper, and aluminum is added thereto.

A barrier metal film indicates an electrically conductive film having barrier characteristics, and covering sides and a bottom of a wire therewith in order to prevent metal elements constituting a wire from dispersing into an interlayer insulating film and/or an underlying film.

For instance, if a wire contains copper as a principal constituent, a barrier metal film is comprised of a film composed of refractive metals such as Ta, TaN, TiN and WCN, or nitride thereof in the form of a single layer or in the form of a multi-layered structure.

A semiconductor substrate indicates a substrate on which a semiconductor device is fabricated. In particular, a semiconductor substrate indicates not only a monocrystal silicon substrate, but also a SOI (Silicon on Insulator) substrate or a TFT (Thin Film Transistor) substrate used for a liquid crystal display device.

An interlayer insulating film indicates a film which electrically insulates wire layers from each other. An interlayer insulating film may contain holes therein in order to reduce a capacity between wire layers.

As an interlayer insulating film, there may be typically used a $SiO_2$ film, a HSQ (HydrogenSilsesquioxane) film (for instance, Type 12 (Registered Trademark)), a MSQ (Methyl-Silsesquioxane) film (for instance, a JSR-LKD (Registered Trademark) film, an ALCAP (Registered Trademark) film, an NCS (Registered Trademark) film, an IPS (Registered Trademark) film or a HOSP (Registered Trademark) film), an organic polymer film (for instance, a SiLK (Registered Trademark) film or a Flare (Registered Trademark) film), a SiOCH film, a SiOC film (for instance, a Black Diamond (Registered Trademark) film, a CORAL (Registered Trademark) film, an AuroraULK (Registered Trademark) film, or an Orion (Registered Trademark) film), or an electrically insulating thin film comprised of the above-mentioned films to which organic material is added.

As a sputtering process, there may be used, as well as an ordinary sputtering process, a highly directive sputtering process such as a long throw sputtering process, a collimate sputtering process, or an ionized sputtering process, in order to enhance both burying characteristics and film quality, and uniformize a film thickness within a wafer. When a sputtering process is applied to alloy, a metal other than a principal constituent is added into a metal target at a rate equal to or smaller than a solution limit, in which case, an alloy film can be formed as a resultant metal film.

CMP (Chemical Mechanical Polishing) is a process for eliminating roughness formed at a surface of a wafer during a process of fabricating a multi-layered wires, to thereby planarize a surface of the wafer by flowing a polishing agent onto the wafer, and causing the wafer to make contact with a rotating polishing pad. When a wire layer is to be fabricated in accordance with the damascene process, CMP is carried out in order to remove excessive metal to thereby planarize a surface of a wafer, after the metal is buried in wire trenches or via-holes.

A hard mask indicates an electrically insulating film to be formed on an interlayer insulating film for protecting the interlayer insulating film, when it is difficult to carry out CMP because a dielectric constant of the interlayer insulating film is reduced with the result of reduction in strength of the interlayer insulating film.

EM (Electromigration) lifetime indicates a failure probability. First, variance in a resistance increase or breakage in a wire due to electron winds is estimated by carrying out an acceleration test, and then, a failure probability in an area in which a wire is actually used is estimated. The thus estimated failure probability is EM lifetime.

For instance, a predetermined acceleration current (for instance, 6.4 $MA/cm^2$) is applied to TEG (Test Element Group) comprised of predetermined wires and vias at a predetermined acceleration temperature (for instance, 300 degrees centigrade). Then, failure time is calculated based on both a time during which the test was carried out, and variance in a resistance. Based on the failure times, it is possible to judge whether EM lifetime is long or short.

A SIV (Stress Induced Voiding) lifetime or a stress-inducing void lifetime indicates an estimate of a resistance increase or breakage of a wire due to a wire stress, obtained by keeping a wire at a constant temperature for long hours.

For instance, TEG (Test Element Group) comprised of predetermined wires and vias is kept at a predetermined acceleration temperature (for instance, 150 degrees centigrade) for about 500 hours. Then, failure time is calculated based on both the time during which TEG was kept at a predetermined acceleration temperature, and variance in a resistance. Based on the calculated failure times, it is possible to judge whether SIV lifetime is long or short.

(First Embodiment)

FIG. 1 is a cross-sectional view of a semiconductor device in accordance with the first embodiment of the present invention. A wire structure in the semiconductor device in accordance with the first embodiment is explained hereinbelow with reference to FIG. 1.

In the first embodiment, the present invention is applied to a dual damascene wire structure.

As illustrated in FIG. 1, the semiconductor device in accordance with the first embodiment of the present invention is comprised of a semiconductor substrate 1 on which a semiconductor element (not illustrated) is formed, an interlayer insulating film 2 formed on the semiconductor substrate 1, a first etching-stopper film 3a formed on the interlayer insulating film 2, a first barrier metal film 4a formed on the first etching-stopper film 3a, a first alloy wire 5a formed on the first barrier metal film 4a in accordance with a damascene process, a first wire-protection film 6a formed partially on the first alloy wire 5a, a via interlayer insulating film 7 formed on the first wire-protection film 6a, a second etching-stopper film 3b formed on the via interlayer insulating film 7, a second barrier metal film 4b covering an upper surface of the second etching-stopper film 3b, a sidewall of a via-hole formed throughout the second etching-stopper film 3b, the via interlayer insulating film 7, and the first wire-protection film 6a, and an upper surface of the first alloy wire 5a therewith, a second alloy wire 5b covering the second barrier metal film 4b therewith, and a second wire-protection film 6b formed on the second alloy wire 5b.

The second alloy wire 5b covered with the second barrier metal film 4b defines both a via and a wire.

The first wire-protection film 6a covering an upper surface of the first alloy wire 5a therewith contains at least one of metal elements among metal elements contained in the first alloy wire 5a.

The second wire-protection film 6b covering an upper surface of the second alloy wire 5b therewith contains at least one of metal elements among metal elements contained in the second alloy wire 5b.

Each of the first etching-stopper film 3a and the second etching-stopper film 3b is comprised of, for instance, a $SiO_2$ film, a SiN film, a SiC film, a SiCN film, a SiOC film, a SiOCH film, these films containing organic material, a film containing organic material as a principal constituent, and a film containing organic material as a principal constituent, and further containing SiO, singly or in combination.

The first etching-stopper film 3a and the second etching-stopper film 3b are formed to make it easy to form a wire trench in the form of a dual damascene, and a via-hole. It is preferable that they are composed of $SiO_2$ or DVS-BCB (divinylsiloxane-benzocyclobutene) synthesized by a plasma polymerization process.

The via interlayer insulating film 7 may be comprised of, for instance, a $SiO_2$ film, a SiC film, a SiCN film, a HSQ (HydrogenSilsesquioxane) film (for instance, Type 12 (Registered Trademark)), a MSQ (MethylSilsesquioxane) film (for instance, a JSR-LKD (Registered Trademark) film, an ALCAP (Registered Trademark) film, an NCS (Registered Trademark) film, an IPS (Registered Trademark) film or a HOSP (Registered Trademark) film), an organic polymer film (for instance, a SiLK (Registered Trademark) film or a Flare (Registered Trademark) film), a SiOCH film, a SiOC film (for instance, a Black Diamond (Registered Trademark) film, a CORAL (Registered Trademark) film, an AuroraULK (Registered Trademark) film, or an Orion (Registered Trademark) film), an electrically insulating thin film comprised of the above-mentioned films to which organic material is added, a film having a multi-layered structure comprised of a plurality of any one of the above-mentioned films, or any one of the above-mentioned films having a composition and/or a density varying in a depth-wise direction.

The first barrier metal film 4a and the second barrier metal film 4b may be formed by a sputtering process, CVD or ALCVD (Atomic Layer Chemical Vapor Deposition).

The first barrier metal film 4a and the second barrier metal film 4b may be comprised of a film composed of refractive metals such as Ta, TaN, TiN and WCN, or nitride thereof in the form of a single layer or in the form of a multi-layered structure. In particular, it is preferable that the first barrier metal film 4a and the second barrier metal film 4b have a multi-layered structure of Ta/TaN (upper layer/lower layer).

The first alloy wire 5a and the second alloy wire 5b can be formed by a sputtering process through the use of an alloy target, CVD, or an electrolytic plating process in which a film fabricated in accordance with the sputtering process or CVD is used as an electrode.

A metal element to be contained in the first alloy wire 5a and the second alloy wire 5b has to be dissolved into the principal constituent, and is selected among metal elements satisfying one of the following requirements.

(1) a metal which prevents dispersion of alloy by addition thereof into the alloy, that is, a metal which can stabilize grain boundary of a metal as a principal constituent.

(2) a metal generating migration in preference to a metal as a principal constituent, and delaying generation of migration in a metal as a principal constituent.

(3) a metal which prevents a metal as a principal constituent in an alloy wire from being oxidized, that is, a metal which is more likely to be oxidized than a metal as a principal constituent.

(4) a metal which forms a stable oxide film over a surface of a wire when oxidized, to thereby prevent oxygen from penetrating an alloy wire.

As a metal element to be contained in the first alloy wire 5a and the second alloy wire 5b, at least one metal element can be selected among aluminum, copper, tin, titanium, tungsten, silver, zirconium, indium and magnesium.

It is preferable to fabricate a wire in accordance with an ionized sputtering process through the use of a copper/aluminum alloy target containing aluminum at 0.5 to 2.0 at. %. Specifically, first, a copper/aluminum alloy seed layer is formed, and then, copper is buried by electrolytic plating process in which the copper/aluminum alloy seed layer is used as an electrode.

When an alloy seed layer and electrolytic plating process are combined to each other, a concentration of a metal element in the first and second alloy wires 5a and 5b is equal to or smaller than a concentration of the metal element in an alloy target.

Each of the first wire-protection film 6a and the second wire-protection film 6b each covering upper surfaces of the first and second alloy wires 5a and 5b therewith, respectively, is comprised of a film containing at least one of metal elements contained in the first and second alloy wires 5a and 5b. For instance, each of the first wire-protection film 6a and the second wire-protection film 6b may be comprised of at least one of a SiN film, a SiC film, a SiCN film, a SiOC film, a SiOCH film, these films containing organic material, a film containing organic material as a principal constituent, and a film containing organic material as a principal constituent, and further containing SiO.

Each of the first wire-protection film 6a and the second wire-protection film 6b may be comprised of a DVS-BCB (divinylsiloxane-benzocyclobutene) film fabricated in accordance with a plasma polymerization process, or a film composed of DVS-BCB compound. BCB compound indicates compound synthesized by mixing BCB with a plurality gaseous materials. It is possible to reduce a dielectric constant among wires by using a BCB film or a film composed of BCB compound.

It is necessary to add metals into the first wire-protection film 6a and the second wire-protection film 6b as long as insulation performance of the films are not deteriorated regardless of addition of metals thereinto. According to the analysis of the inventors, it was found out that if a concentration of metals in the first wire-protection film 6a and the second wire-protection film 6b is equal to or smaller than 1 at. %, it would be possible to maintain insulation performance of the first and second wire-protection films 6a and 6b, and prevent generation of electromigration and stress-inducing voids, the latter being an advantage presented by the present invention.

A metal element can be added into the first wire-protection film 6a and the second wire-protection film 6b, for instance, by thermally annealing the films at 200 to 350 degrees centigrade for 1 to 30 minutes to cause thermal dispersion of a metal element into the first wire-protection film 6a and the second wire-protection film 6b from the first alloy wire 5a and the second alloy wire 5b, respectively, causing the first wire-protection film 6a and the second wire-protection film 6b containing a selected metal element to grow on the first alloy wire 5a and the second alloy wire 5b, dispersing an element containing a metal element into both the first alloy wire 5a and the second alloy wire 5b and an electrically insulating film, or causing the first wire-protection film 6a and the second wire-protection film 6b containing a selected metal element to grow on the first alloy wire 5a and the second alloy wire 5b.

The advantages presented by the present invention can be enhanced by designing a profile of a metal element in the first wire-protection film 6a and the second wire-protection film 6b to be higher at a location closer to the first alloy wire 5a and the second alloy wire 5b, respectively.

The advantages presented by the present invention can be enhanced by designing a concentration of a metal element which is other than a principal constituent of the first alloy wire 5a and the second alloy wire 5b, and is contained in the first wire-protection film 6a and the second wire-protection film 6b, to be high both in the vicinity of the first wire-protection film 6a and the second wire-protection film 6b, and in the vicinity of the first barrier metal film 4a and the second barrier metal film 4b.

The wire having the above-mentioned structure makes it possible to enhance adhesion between the first alloy wire 5a and the second alloy wire 5b, and the first wire-protection film 6a and the second wire-protection film 6b, and further, enhance a resistance to both electromigration and stress-inducing voids.

Specifically, at least one of metal elements contained in the first alloy wire 5a and the second alloy wire 5b is designed to be contained in the first wire-protection film 6a and the second wire-protection film 6b covering upper surfaces of the first alloy wire 5a and the second alloy wire 5b therewith, respectively. As a result, there is formed an adhesion layer between the first alloy wire 5a and the second alloy wire 5b, and the first wire-protection film 6a and the second wire-protection film 6b, respectively. The adhesion layer has a structure which is intermediate between the structures of the first alloy wire 5a and the second alloy wire 5b, and the structures of the first wire-protection film 6a and the second wire-protection film 6b. Thus, since adhesion between surface of the first alloy wire 5a and the second alloy wire 5b and surfaces of the first wire-protection film 6a and the second wire-protection film 6b, respectively, is enhanced, it is possible to suppress both dispersion of a metal element contained in the alloy wires at the interfaces, which causes electromigration, and dispersion of holes existing in the alloy wires, which causes stress-inducing voids. Hence, reliability to the wire can be significantly enhanced.

Furthermore, it is possible to improve adhesion at the interfaces between the first alloy wire 5a and the second alloy wire 5b and the first wire-protection film 6a and the second wire-protection film 6b, respectively, and suppress an increase in a wire resistance by designing a concentration of a metal element containing commonly in the first alloy wire 5a and the second alloy wire 5b, and the first wire-protection film 6a and the second wire-protection film 6b covering upper surfaces of the first alloy wire 5a and the second alloy wire 5b therewith, respectively, to be higher in the vicinity of the first wire-protection film 6a and the second wire-protection film 6b than in central areas of the first alloy wire 5a and the second alloy wire 5b.

Figure 24:
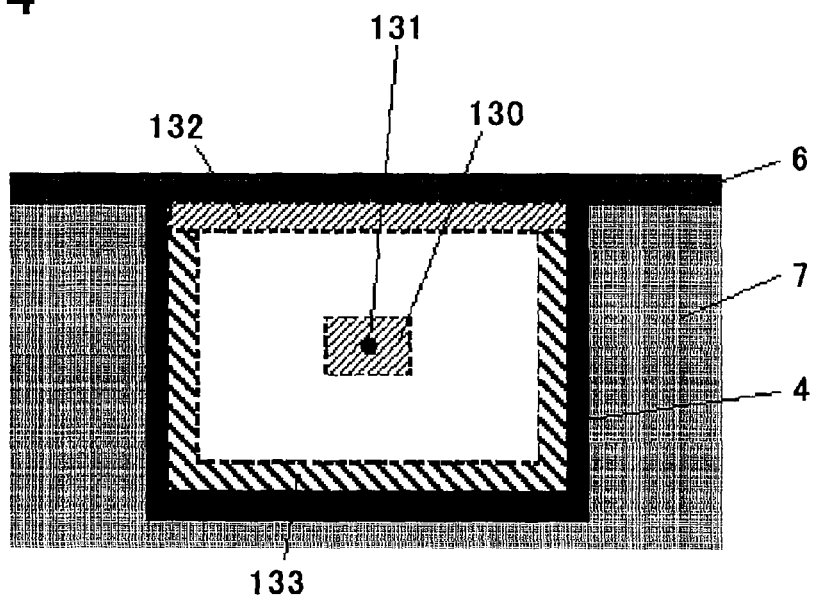
FIG. 24 is a cross-sectional view illustrating an alloy wire having a central area, an area located in the vicinity of a wire-protection film, and an area located in the vicinity of a barrier metal film.

FIG. 24 is a cross-sectional view illustrating the alloy wire having a central area, an area located in the vicinity of a wire-protection film, and an area located in the vicinity of a barrier metal film.

The central area 130 of the alloy wire is defined, for instance, as an area extending from a center 131 of the alloy wire in a height-wise direction of the alloy wire by 10% of a height of the alloy wire, and further extending from the center 131 in a width-wise direction of the alloy wire by 10% of a width of the alloy wire.

The area 132 located in the vicinity of a wire-protection film is defined as an area extending from a wire-protection film 6 by 10% of a height of the alloy wire.

For instance, assuming that the first alloy wire 5a is composed of copper/aluminum alloy containing copper as a principal constituent, and additionally containing aluminum as a metal element at I at. % or below, the first wire-protection film 6a is comprised of a SiCN film, and the first alloy wire 5a has a height of 200 nm, it would be possible to suppress an increase in a resistance of the first alloy wire 5a and enhance reliability to the first alloy wire 5a by designing the first alloy wire 5a existing within 10 nm from the first wire-protection film 6a (SiCN film) to contain aluminum at 1 at. %, and the first alloy wire 5a existing within 100 nm from the first wire-protection film 6a to contain aluminum at 0.08 at. %.

Furthermore, it is possible to suppress oxidation of surface of the first and second barrier metal films 4a and 4b by designing a concentration of metal elements other than a principal constituent of the first alloy wire 5a and the second alloy wire 5b to be high in the vicinity of the first and second barrier metal films 4a and 4b. Hence, it is possible to enhance adhesion between interfaces between the first alloy wire 5a and the second alloy wire 5b, and the first barrier metal film 4a and the second barrier metal film 4b, respectively. By using both this technique and the technique for enhancing adhesion between the first alloy wire 5a and the second alloy wire 5b, and the first wire-protection film 6a and the second wire-protection film 6b, respectively, it is possible to enhance adhesion at all interfaces surrounding the first alloy wire 5a and the second alloy wire 5b, ensuring further enhancement in reliability to the alloy wires.

The area 133 located in the vicinity of a barrier metal film is defined, for instance, as an area extending from a bottom of the barrier metal film 4 by 10% of a height of the alloy wire, and further extending from a sidewall of the barrier metal film 4 by 10% of a width of the alloy wire.

For instance, assuming that the first alloy wire 5a is composed of copper/aluminum alloy containing copper as a principal constituent, and additionally containing aluminum as a metal element at 1 at. % or below, the barrier metal film 4 is comprised of a Ta/TaN film, and the first alloy wire 5a has a height of 200 nm and a width of 200 nm, it would be possible to prevent a surface of the barrier metal film 4 from being oxidized, and enhance reliability to the first alloy wire 5a by designing the first alloy wire 5a existing within 20 mm from the barrier metal film (Ta/TaN film) 4 to contain aluminum at 1 at. %, and the first alloy wire 5a existing within 100 nm from the barrier metal film 4 to contain aluminum at 0.08 at. %.

Furthermore, it is possible to enhance adhesion between the first and second alloy wires 5a, 5b and the first and second wire-protection films 6a, 6b, respectively, by causing the wire-protection films to contain a metal element which is a principal constituent of the first and second alloy wires 5a and 5b and which is not likely to be contained in the wire-protection films, by virtue of metal elements other than a principal constituent, contained in the first and second alloy wires 5a and 5b.

For instance, assuming that the first alloy wire 5a is composed of copper/aluminum alloy containing copper as a principal constituent, and additionally containing aluminum as a metal element at 1 at. % or below, and the first wire-protection film 6a is comprised of a SiCN film, if the first wire-protection film 6a is caused to contain aluminum by thermal dispersion caused by thermal annealing at 350 degrees centigrade, copper is dispersed in the first wire-protection film 6a as aluminum dissolves in the first wire-protection film 6a.

This ensures further enhancement of the adhesion, and enhances reliability to the first alloy wire 5a.

With respect to the first alloy wire 5a having been fabricated in the above-mentioned way, composed of alloy wire, the adhesion between the first wire-protection film (SiCN film) 6 and the first alloy wire (copper alloy) 5a was tested through a test for estimating adhesion between thin films, such as a four-point bending test. It was confirmed by the test that the adhesion was enhanced.

Whereas a wire is composed of copper or copper alloy, and the first wire-protection film 6a is comprised of a SiCN film in a conventional semiconductor device, a wire is composed of copper/aluminum alloy, and the first wire-protection film 6a is comprised of a SiCN film containing copper or aluminum. The inventors had experimentally confirmed that it was possible to suppress generation of voids at an interface between the alloy wire connected to a via having a diameter of 100 nm, and the wire-protection film.

Figure 5:
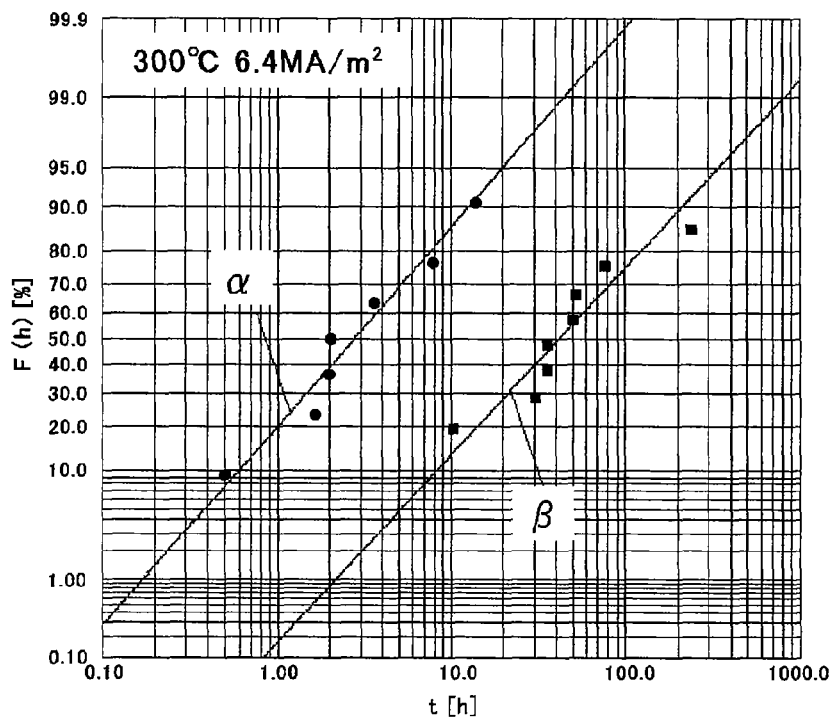
FIG. 5 is a graph showing results of measurement of electromigration lifetime in a conventional wire and the semiconductor device in accordance with the first embodiment of the present invention.

FIG. 5 is a graph showing the results of measurement of electromigration lifetime in a conventional wire structure and the wire structure in accordance with the first embodiment.

The conditions for testing the electromigration lifetime are 300 degrees centigrade, and 6.4 MA/cm$^2$. In FIG. 5, "." indicates the measurement results for the conventional wire structure, and "." indicates the measurement results for the wire structure in accordance with the present invention. In FIG. 5, the axis of abscissa indicates a time having passed until a failure occurred, and the axis of ordinates indicates logarithmic normal distribution in which the failure profile is plotted.

The measurement results shown in FIG. 5 indicate that the wire structure in accordance with the first embodiment present significantly longer electromigration lifetime than that of the conventional wire structure. For instance, when F is equal to 50%, ten times or more improvement can be obtained.

Figure 6:
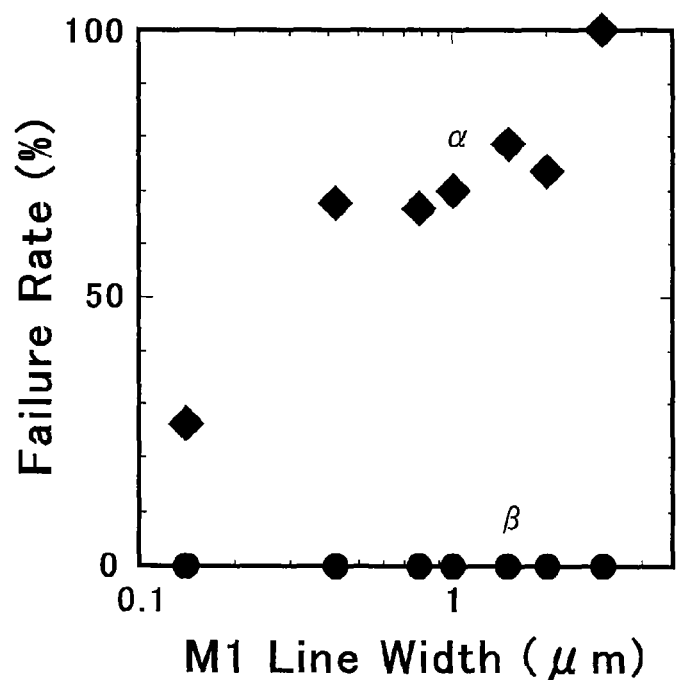
FIG. 6 is a graph showing results of measurement of a resistance to stress-inducing voids in a conventional wire and the semiconductor device in accordance with the first embodiment of the present invention.

FIG. 6 is a graph showing the results of measurement of a resistance to stress-inducing voids in a conventional wire structure and the wire structure in accordance with the first embodiment.

In FIG. 6, the axis of abscissa indicates a line width (micrometers) of TEG to be estimated, and the axis of ordinates indicates failure rate (%).

There was conducted the test in which the conventional wire structure and the wire structure in accordance with the first embodiment were kept at 150 degrees centigrade for 500 hours. Whereas the failure rate (.) of the conventional wire structure was 27 to 100%, the failure rate (.) of the wire structure in accordance with the first embodiment was almost zero. Thus, it was found out that the wire structure (.) in accordance with the first embodiment made it possible to remarkably reduce a failure rate in comparison with the conventional wire structure (.).

Furthermore, leakage current running through alloy wires was measured in the wire structure in accordance with the first embodiment. It was found out that a leakage current in the wire structure in accordance with the first embodiment was identical with a leakage current in the conventional wire structure.

In the wire structure in accordance with the first embodiment, a metal element commonly contained in the copper alloy wire is added into the wire-protection film acting as an electrically insulating film as long as insulation property of the wire-protection film is not deteriorated. Thus, it is possible to enhance a resistance to both electromigration and stress-inducing voids without an increase in current leakage. As a result, it is possible to accomplish higher adhesion with the copper alloy film than a case wherein an electrically insulating film not containing a metal element contained in the alloy wire is used as a wire-protection film, ensuring prevention of generation of electromigration and stress-inducing voids.

The wire structure in accordance with the first embodiment can be recognized in a final product. If a semiconductor device including a memory circuit such as DRAM (Dynamic Random Access Memory), SRAM (Static Random Access Memory), a flush memory, FRAM (Ferro Electric Random Access Memory), MRAM (Magnetic Random Access Memory), and a memory having a variable resistance, a semiconductor device including a logic circuit such as a microprocessor, a semiconductor device including both a memory circuit and a logic circuit, or SIP (Silicon In Package) including these semiconductor devices in a multi-layered configuration is designed to have at least partially a (multi-layered) wire, it would be possible to judge whether the wire structure in accordance with the first embodiment is included in the wire, by measuring a metal concentration in a metal wire and a wire-protection film.

Specifically, it is possible to compare a metal wire and a wire-protection film to each other through a contrast of an image of a cross-section of a semiconductor device, obtained by TEM. It is possible to check a concentration of a metal contained in a metal wire and a wire-protection film by conducting element analysis such as EELS (Electron Energy-Loss Spectroscopy) or EDX (Energy-Dispersive X-ray Spectroscopy) as well as TEM.

In particular, it is possible to accurately measure a concentration of a metal contained in a metal wire and a wire-protection film by identifying grain boundary existing in the metal wire, based on a contrast of the TEM images, and conducting analysis of elements existing in the vicinity of the grain boundary.

Furthermore, it is possible to identify a metal element by conducting element analysis such as SIMS (Second Ion Mass Spectroscopy) to a horizontally cut-out sample in a predetermined area.

A method of processing a dual-damascene trench is not to be limited to a specific method, and may be arbitrarily selected.

(Second Embodiment)

Figure 2:
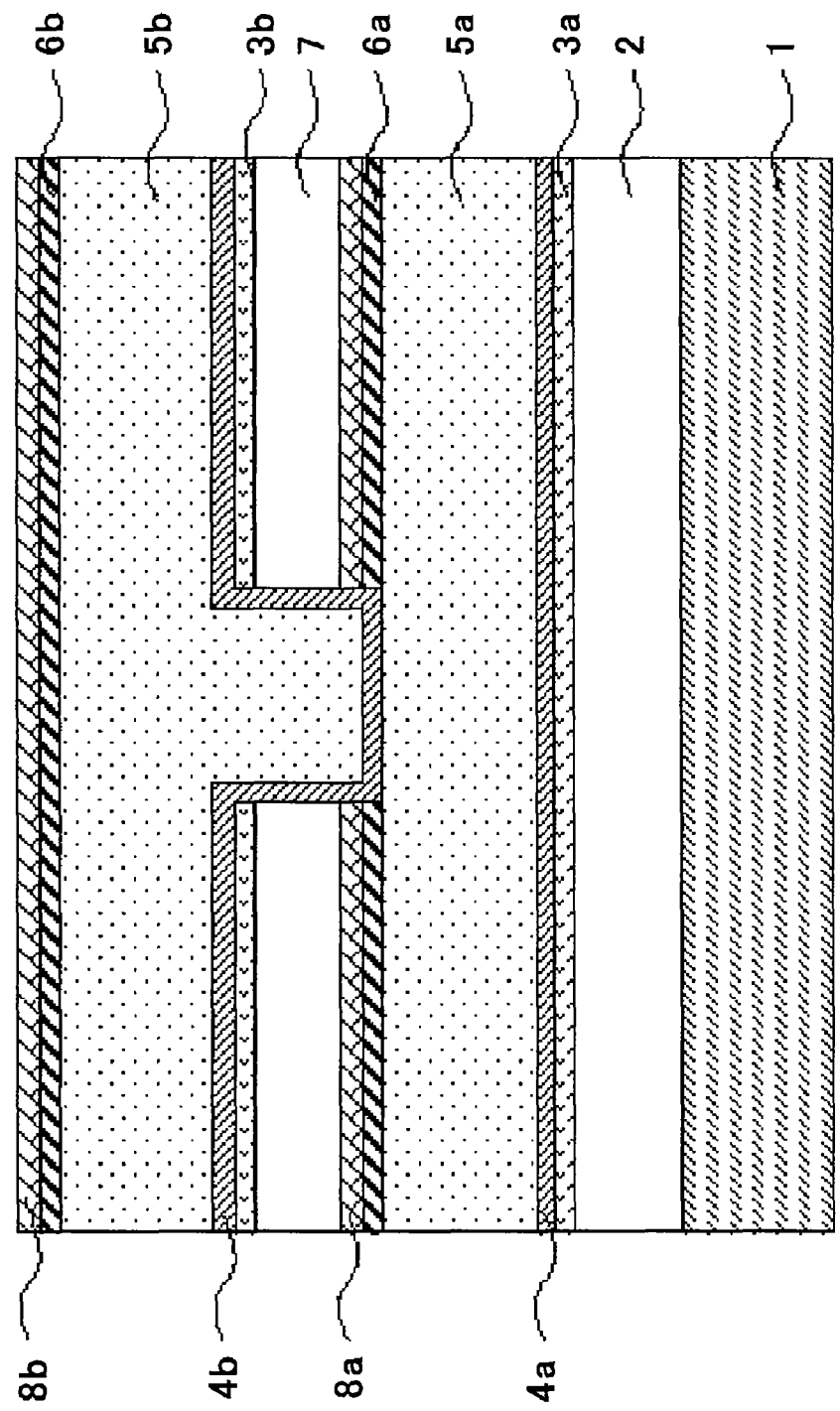
FIG. 2 is a cross-sectional view illustrating a semiconductor device in accordance with the second embodiment of the present invention.

FIG. 2 is a cross-sectional view of a semiconductor device in accordance with the second embodiment of the present invention. A wire structure in the semiconductor device in accordance with the second embodiment is explained hereinbelow with reference to FIG. 2.

In the semiconductor device in accordance with the second embodiment, a wire-protection film is designed to have a varied structure in comparison with the semiconductor device in accordance with the first embodiment.

Whereas the semiconductor device in accordance with the first embodiment is designed to include the first and second wire-protection films 6a and 6b both of which are single-layered, the semiconductor device in accordance with the second embodiment is designed to include a two-layered structure comprised of the first wire-protection film 6a and a third wire-protection film 8a, in place of the single-layered first wire-protection film 6a, and further include a two-layered structure comprised of the second wire-protection film 6b and a fourth wire-protection film 8b, in place of the single-layered second wire-protection film 6b. The semiconductor device in accordance with the second embodiment is structurally identical to the semiconductor device in accordance with the first embodiment except the varied structures of the wire-protection films.

Each of the third and fourth wire-protection films 8a and 8b may be comprised of a SiN film, a SiC film, a SiCN film, a SiOC film, a SiOCH film, these films containing organic material therein, a film containing organic material as a principal constituent, a film containing organic material as a principal constituent, and further containing SiO, in a single-layered structure or a multi-layered structure.

Similarly to the semiconductor device in accordance with the first embodiment, the semiconductor device in accordance with the second embodiment makes it possible to enhance adhesion between the first and second alloy wires 5a, 5b and the first and second wire-protection films 6a, 6b, respectively, and present a dual-damascene wire having a high resistance to both electromigration and stress-inducing voids.

Furthermore, since the third and fourth wire-protection films 8a and 8b not containing a metal element are formed on the first and second wire-protection films 6a and 6b, respectively, it is possible to enhance adhesion between the third and fourth wire-protection films 8a and 8b, and interlayer insulating films formed on the third and fourth wire-protection films 8a and 8b.

Though the wire-protection films in the second embodiment are designed to have a two-layered structure, the wire-protection films may be designed to have three-, four- or more layered structure.

(Third Embodiment)

Figure 3:
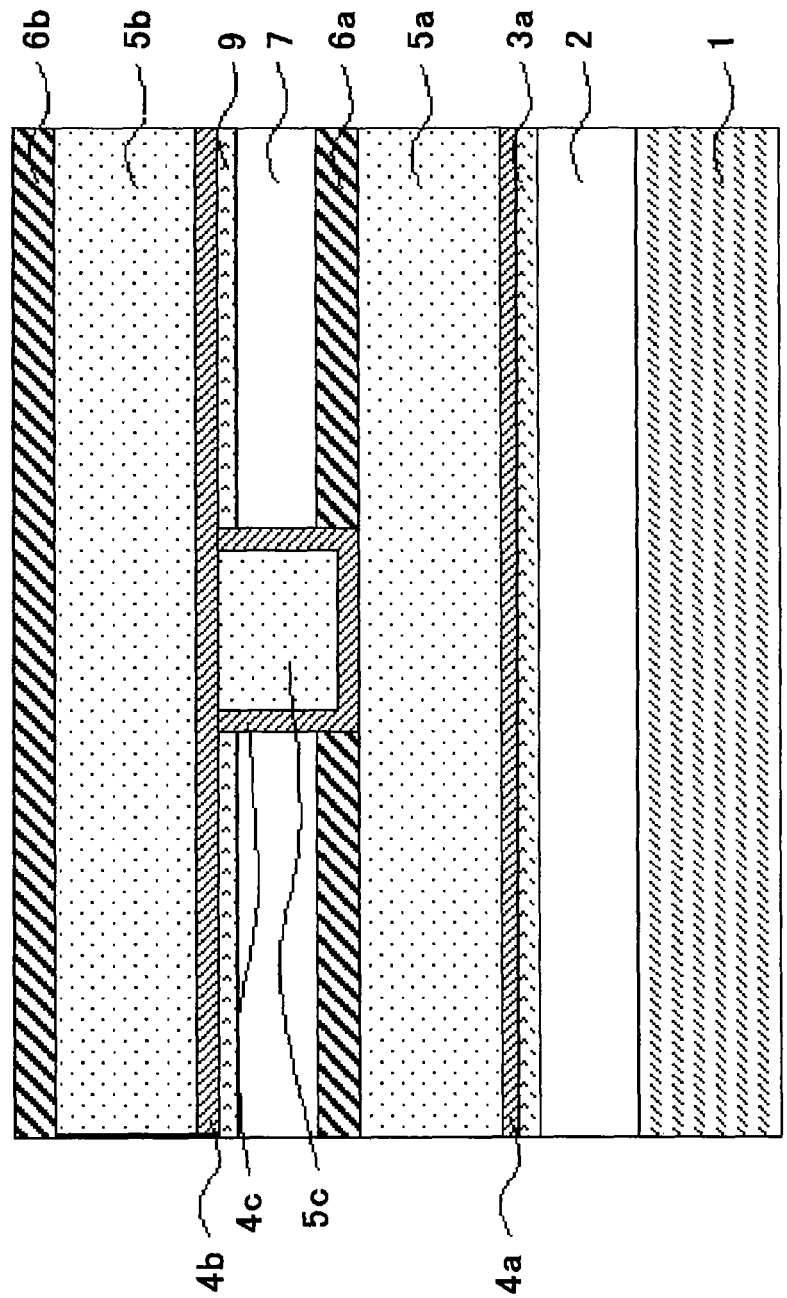
FIG. 3 is a cross-sectional view illustrating a semiconductor device in accordance with the third embodiment of the present invention.

FIG. 3 is a cross-sectional view of a semiconductor device in accordance with the third embodiment of the present invention. A wire structure in the semiconductor device in accordance with the third embodiment is explained hereinbelow with reference to FIG. 3.

In the third embodiment, the present invention is applied to a single damascene wire structure.

As illustrated in FIG. 3, the semiconductor device in accordance with the third embodiment of the present invention is comprised of a semiconductor substrate 1 on which a semiconductor element (not illustrated) is formed, an interlayer insulating film 2 formed on the semiconductor substrate 1, a first etching-stopper film 3a formed on the interlayer insulating film 2, a first barrier metal film 4a formed on the first etching-stopper film 3a, a first alloy wire 5a formed on the first barrier metal film 4a in accordance with a single damascene process, a first wire-protection film 6a formed partially on the first alloy wire 5a, a via interlayer insulating film 7 formed on the first wire-protection film 6a, a via layer hard mask 9 formed on the via interlayer insulating film 7, a third barrier metal film 4c covering therewith a sidewall of a via-hole formed throughout the via layer hard mask 9, the via interlayer insulating film 7 and the first wire-protection film 6a, and an exposed surface of the first alloy wire 5a, a via contact 5c formed in accordance with a single damascene process in a via-hole covered with the third barrier metal film 4c, a second barrier metal film 4b covering the via layer hard mask 9, the third barrier metal film 4c and the alloy via 5c therewith, a second alloy wire 5b formed in accordance with a single damascene process on the second barrier metal film 4b, and a second wire-protection film 6b formed on the second alloy wire 5b.

The first wire-protection film 6a covering an upper surface of the first alloy wire 5a therewith contains at least one of metal elements among metal elements contained in the first alloy wire 5a.

The second wire-protection film 6b covering an upper surface of the second alloy wire 5b therewith contains at least one of metal elements among metal elements contained in the second alloy wire 5b.

The via contact 5c in the third embodiment is composed of alloy. However, it is always not necessary for the via contact 5c to be composed of alloy. The via contact 5c may be composed of a metal in line with characteristics required to a wire, if sufficient reliability to the wire is ensured.

Each of the first etching-stopper film 3a and the via layer hard mask 9 is comprised of, for instance, a $SiO_2$ film, a SiN film, a SiC film, a SiCN film, a SiOC film, a SiOCH film, these films containing organic material, a film containing organic material as a principal constituent, and a film containing organic material as a principal constituent, and further containing SiO, singly or in combination.

The via interlayer insulating film 7 may be comprised of, for instance, a $SiO_2$ film, a SiC film, a SiCN film, a HSQ (HydrogenSilsesquioxane) film (for instance, Type 12 (Registered Trademark)), a MSQ (MethylSilsesquioxane) film (for instance, a JSR-LKD (Registered Trademark) film, an ALCAP (Registered Trademark) film, an NCS (Registered Trademark) film, an IPS (Registered Trademark) film or a HOSP (Registered Trademark) film), an organic polymer film (for instance, a SiLK (Registered Trademark) film or a Flare (Registered Trademark) film), a SiOCH film, a SiOC film (for instance, a Black Diamond (Registered Trademark) film, a CORAL (Registered Trademark) film, an AuroraULK (Registered Trademark) film, or an Orion (Registered Trademark) film), an electrically insulating thin film comprised of the above-mentioned films to which organic material is added, a film having a multi-layered structure comprised of a plurality of any one of the above-mentioned films, or any one of the above-mentioned films having a composition and/or a density varying in a depth-wise direction.

The first barrier metal film 4a and the second barrier metal film 4b may be formed by a sputtering process, CVD or ALCVD (Atomic Layer Chemical Vapor Deposition).

The first barrier metal film 4a and the second barrier metal film 4b may be comprised of a film composed of refractive metals such as Ta, TaN, TiN and WCN, or nitride thereof in the form of a single layer or in the form of a multi-layered structure. In particular, it is preferable that the first barrier metal film 4a and the second barrier metal film 4b have a multi-layered structure of Ta/TaN (upper layer/lower layer).

The first alloy wire 5a, the second alloy wire 5b and the via contact 5c can be formed by a sputtering process through the use of an alloy target, CVD, or an electrolytic plating process in which a film fabricated in accordance with the sputtering process or CVD is used as an electrode.

A metal element to be contained in the first alloy wire 5a, the second alloy wire 5b and the via contact 5c has to be dissolved into the principal constituent, and is selected among metal elements satisfying one of the following requirements.

(1) a metal which prevents dispersion of alloy by addition thereof into the alloy, that is, a metal which can stabilize grain boundary of a metal as a principal constituent.

(2) a metal generating migration in preference to a metal as a principal constituent, and delaying generation of migration in a metal as a principal constituent.

(3) a metal which prevents a metal as a principal constituent in an alloy wire from being oxidized, that is, a metal which is more likely to be oxidized than a metal as a principal constituent.

(4) a metal which forms a stable oxide film over a surface of a wire when oxidized, to thereby prevent oxygen from penetrating an alloy wire.

As a metal element to be contained in the first alloy wire 5a, the second alloy wire 5b and the via contact 5c, at least one metal element can be selected among aluminum, copper, tin, titanium, tungsten, silver, zirconium, indium and magnesium.

It is preferable to fabricate a wire in accordance with an ionized sputtering process through the use of a copper/aluminum alloy target containing aluminum at 0.5 to 2.0 at. %. Specifically, first, a copper/aluminum alloy seed layer is formed, and then, copper is buried by electrolytic plating process in which the copper/aluminum alloy seed layer is used as an electrode.

When an alloy seed layer and electrolytic plating process are combined to each other, a concentration of a metal element in the first and second alloy wires 5a and 5b and the via contact 5c is equal to or smaller than a concentration of the metal element in an alloy target.

Each of the first wire-protection film 6a and the second wire-protection film 6b each covering upper surfaces of the first and second alloy wires 5a and 5b therewith, respectively, is comprised of a film containing at least one of metal elements contained in the first and second alloy wires 5a and 5b. For instance, each of the first wire-protection film 6a and the second wire-protection film 6b may be comprised of at least one of a SiN film, a SiC film, a SiCN film, a SiOC film, a SiOCH film, these films containing organic material, a film containing organic material as a principal constituent, and a film containing organic material as a principal constituent, and further containing SiO.

Each of the first wire-protection film 6a and the second wire-protection film 6b may be comprised of a DVS-BCB (divinylsiloxane-benzocyclobutene) film fabricated in accordance with a plasma polymerization process, or a film composed of DVS-BCB compound. BCB compound indicates compound synthesized by mixing BCB with a plurality gaseous materials. It is possible to reduce a dielectric constant among wires by using a BCB film or a film composed of BCB compound.

It is necessary to add metals into the first wire-protection film 6a and the second wire-protection film 6b as long as insulation performance of the films are not deteriorated regardless of addition of metals thereinto. According to the analysis of the inventors, it was found out that if a concentration of metals in the first wire-protection film 6a and the second wire-protection film 6b is equal to or smaller than 1 at. %, it would be possible to maintain insulation performance of the first and second wire-protection films 6a and 6b, and prevent generation of electromigration and stress-inducing voids, the latter being an advantage presented by the present invention.

A metal element can be added into the first wire-protection film 6a and the second wire-protection film 6b, for instance, by thermally annealing the films at 200 to 350 degrees centigrade for 1 to 30 minutes to cause thermal dispersion of a metal element into the first wire-protection film 6a and the second wire-protection film 6b from the first alloy wire 5a and the second alloy wire 5b, respectively, causing the first wire-protection film 6a and the second wire-protection film 6b containing a selected metal element to grow on the first alloy wire 5a and the second alloy wire 5b, dispersing an element containing a metal element into both the first alloy wire 5a and the second alloy wire 5b and an electrically insulating film, or causing the first wire-protection film 6a and the second wire-protection film 6b containing a selected metal element to grow on the first alloy wire 5a and the second alloy wire 5b.

The advantages presented by the present invention can be enhanced by designing a profile of a metal element in the first wire-protection film 6a and the second wire-protection film 6b to be higher at a location closer to the first alloy wire 5a and the second alloy wire 5b, respectively.

The advantages presented by the present invention can be enhanced by designing a concentration of a metal element which is other than a principal constituent of the first alloy wire 5a and the second alloy wire 5b, and is contained in the first wire-protection film 6a and the second wire-protection film 6b, to be high both in the vicinity of the first wire-protection film 6a and the second wire-protection film 6b, and in the vicinity of the first barrier metal film 4a and the second barrier metal film 4b.

Similarly to the first embodiment, the wire having the above-mentioned structure makes it possible to enhance adhesion between the first alloy wire 5a and the second alloy wire 5b, and the first wire-protection film 6a and the second wire-protection film 6b, and further, enhance a resistance to both electromigration and stress-inducing voids.

Specifically, at least one of metal elements contained in the first alloy wire 5a and the second alloy wire 5b is designed to be contained in the first wire-protection film 6a and the second wire-protection film 6b covering upper surfaces of the first alloy wire 5a and the second alloy wire 5b therewith, respectively. As a result, there is formed an adhesion layer between the first alloy wire 5a and the second alloy wire 5b, and the first wire-protection film 6a and the second wire-protection film 6b, respectively. The adhesion layer has a structure which is intermediate between the structures of the first alloy wire 5a and the second alloy wire 5b, and the structures of the first wire-protection film 6a and the second wire-protection film 6b. Thus, since adhesion between surface of the first alloy wire 5a and the second alloy wire 5b and surfaces of the first wire-protection film 6a and the second wire-protection film 6b, respectively, is enhanced, it is possible to suppress both dispersion of a metal element contained in the alloy wires at the interfaces, which causes electromigration, and dispersion of holes existing in the alloy wires, which causes stress-inducing voids. Hence, reliability to the wire can be significantly enhanced.

Furthermore, it is possible to improve adhesion at the interfaces between the first alloy wire 5a and the second alloy wire 5b and the first wire-protection film 6a and the second wire-protection film 6b, respectively, and suppress an increase in a wire resistance by designing a concentration of a metal element containing commonly in the first alloy wire 5a and the second alloy wire 5b, and the first wire-protection film 6a and the second wire-protection film 6b covering upper surfaces of the first alloy wire 5a and the second alloy wire 5b therewith, respectively, to be higher in the vicinity of the first wire-protection film 6a and the second wire-protection film 6b than in central areas of the first alloy wire 5a and the second alloy wire 5b.

For instance, assuming that the first alloy wire 5a is composed of copper/aluminum alloy containing copper as a principal constituent, and additionally containing aluminum as a metal element at 1 at. % or below, the first wire-protection film 6a is comprised of a SiCN film, and the first alloy wire 5a has a height of 200 nm, it would be possible to suppress an increase in a resistance of the first alloy wire 5a and enhance reliability to the first alloy wire 5a by designing the first alloy wire 5a existing within 10 nm from the first wire-protection film 6a (SiCN film) to contain aluminum at 1 at. %, and the first alloy wire 5a existing within 100 nm from the first wire-protection film 6a to contain aluminum at 0.08 at. %.

Furthermore, it is possible to suppress oxidation of surface of the first and second barrier metal films 4a and 4b by designing a concentration of metal elements other than a principal constituent of the first alloy wire 5a and the second alloy wire 5b to be high in the vicinity of the first and second barrier metal films 4a and 4b. Hence, it is possible to enhance adhesion between interfaces between the first alloy wire 5a and the second alloy wire 5b, and the first barrier metal film 4a and the second barrier metal film 4b, respectively. By using both this technique and the technique for enhancing adhesion between the first alloy wire 5a and the second alloy wire 5b, and the first wire-protection film 6a and the second wire-protection film 6b, respectively, it is possible to enhance adhesion at all interfaces surrounding the first alloy wire 5a and the second alloy wire 5b, ensuring further enhancement in reliability to the alloy wires.

For instance, assuming that the first alloy wire 5a is composed of copper/aluminum alloy containing copper as a principal constituent, and additionally containing aluminum as a metal element at 1 at. % or below, the barrier metal film 4 is comprised of a Ta/TaN film, and the first alloy wire 5a has a height of 200 nm and a width of 200 nm, it would be possible to prevent a surface of the barrier metal film 4a from being oxidized, and enhance reliability to the first alloy wire 5a by designing the first alloy wire 5a existing within 20 nm from the barrier metal film (Ta/TaN film) 4a to contain aluminum at 1 at. %, and the first alloy wire 5a existing within 100 nm from the barrier metal film 4 to contain aluminum at 0.08 at. %.

Furthermore, it is possible to enhance adhesion between the first and second alloy wires 5a, 5b and the first and second wire-protection films 6a, 6b, respectively, by causing the wire-protection films to contain a metal element which is a principal constituent of the first and second alloy wires 5a and 5b and which is not likely to be contained in the wire-protection films, by virtue of metal elements other than a principal constituent, contained in the first and second alloy wires 5a and 5b.

For instance, assuming that the first alloy wire 5a is composed of copper/aluminum alloy containing copper as a principal constituent, and additionally containing aluminum as a metal element at 1 at. % or below, and the first wire-protection film 6a is comprised of a SiCN film, if the first wire-protection film 6a is caused to contain aluminum by thermal dispersion caused by thermal annealing at 350 degrees centigrade, copper is dispersed in the first wire-protection film 6a as aluminum dissolves in the first wire-protection film 6a. This ensures further enhancement of the adhesion, and enhances reliability to the first alloy wire 5a.

With respect to the first alloy wire 5a having been fabricated in the above-mentioned way, composed of alloy wire, the adhesion between the first wire-protection film (SiCN film) 6 and the first alloy wire (copper alloy) 5a was tested through a test for estimating adhesion between thin films, such as a four-point bending test. It was confirmed by the test that the adhesion was enhanced.

The wire structure in accordance with the first embodiment can be recognized in a final product. If a semiconductor device including a memory circuit such as DRAM (Dynamic Random Access Memory), SRAM (Static Random Access Memory), a flush memory, FRAM (Ferro Electric Random Access Memory), MRAM (Magnetic Random Access Memory), and a memory having a variable resistance, a semiconductor device including a logic circuit such as a microprocessor, a semiconductor device including both a memory circuit and a logic circuit, or SIP (Silicon In Package) including these semiconductor devices in a multi-layered configuration is designed to have at least partially a (multi-layered) wire, it would be possible to judge whether the wire structure in accordance with the first embodiment is included in the wire, by measuring a metal concentration in a metal wire and a wire-protection film.

Specifically, it is possible to compare a metal wire and a wire-protection film to each other through a contrast of an image of a cross-section of a semiconductor device, obtained by TEM. It is possible to check a concentration of a metal contained in a metal wire and a wire-protection film by conducting element analysis such as EELS (Electron Energy-Loss Spectroscopy) or EDX (Energy-Dispersive X-ray Spectroscopy) as well as TEM.

In particular, it is possible to accurately measure a concentration of a metal contained in a metal wire and a wire-protection film by identifying grain boundary existing in the metal wire, based on a contrast of the TEM images, and conducting analysis of elements existing in the vicinity of the grain boundary.

Furthermore, it is possible to identify a metal element by conducting element analysis such as SIMS (Second Ion Mass Spectroscopy) to a horizontally cut-out sample in a predetermined area.

A method of processing a single damascene trench is not to be limited to a specific method, and may be arbitrarily selected.

(Fourth Embodiment)

Figure 4:
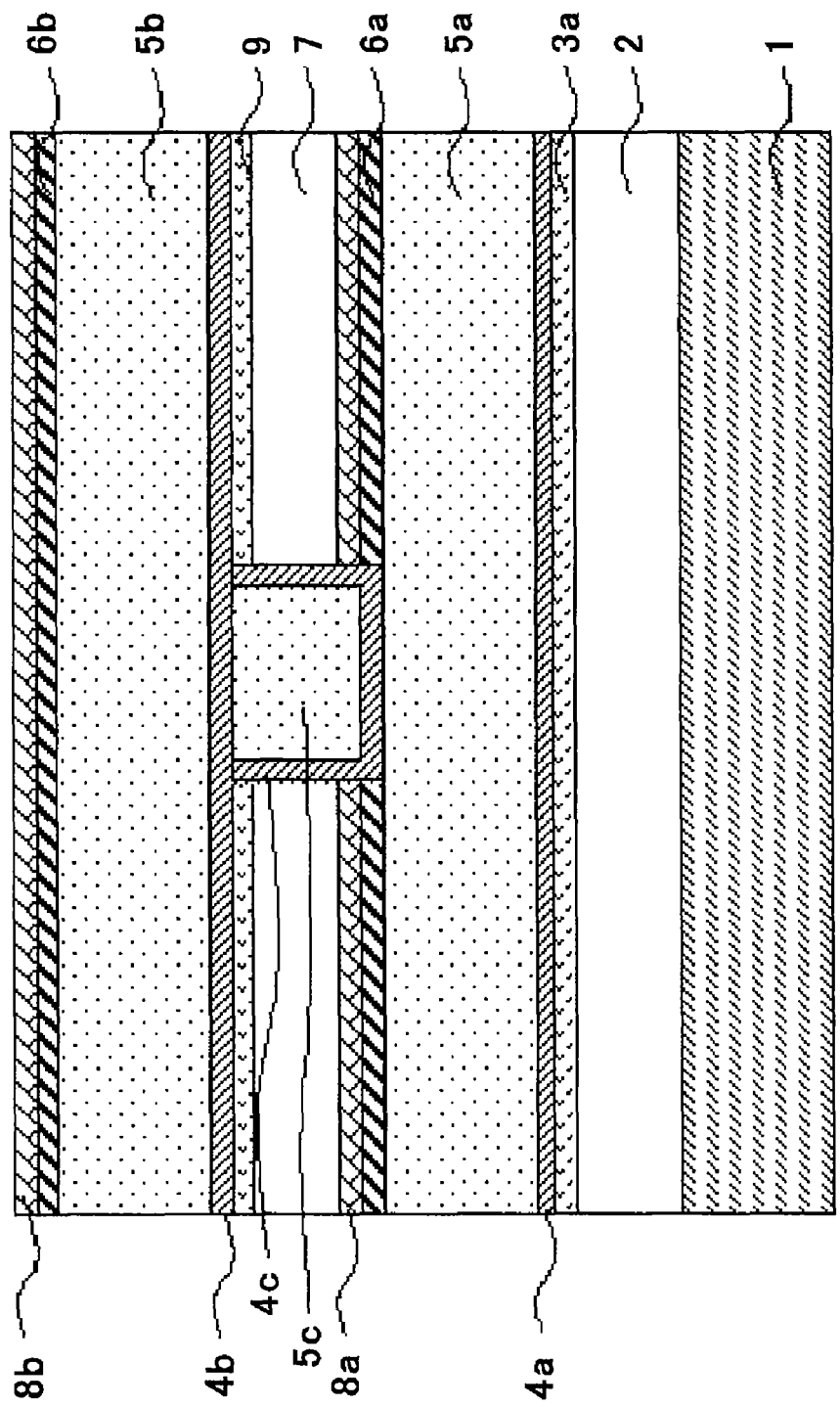
FIG. 4 is a cross-sectional view illustrating a semiconductor device in accordance with the fourth embodiment of the present invention.

FIG. 4 is a cross-sectional view of a semiconductor device in accordance with the fourth embodiment of the present invention. A wire structure in the semiconductor device in accordance with the fourth embodiment is explained hereinbelow with reference to FIG. 4.

In the semiconductor device in accordance with the fourth embodiment, a wire-protection film is designed to have a varied structure in comparison with the semiconductor device in accordance with the third embodiment.

Whereas the semiconductor device in accordance with the third embodiment is designed to include the first and second wire-protection films 6a and 6b both of which are single-layered, the semiconductor device in accordance with the fourth embodiment is designed to include a two-layered structure comprised of the first wire-protection film 6a and a third wire-protection film 8a, in place of the single-layered first wire-protection film 6a, and further include a two-layered structure comprised of the second wire-protection film 6b and a fourth wire-protection film 8b, in place of the single-layered second wire-protection film 6b. The semiconductor device in accordance with the fourth embodiment is structurally identical to the semiconductor device in accordance with the third embodiment except the varied structures of the wire-protection films.

Each of the third and fourth wire-protection films 8a and 8b may be comprised of a SiN film, a SiC film, a SiCN film, a SiOC film, a SiOCH film, these films containing organic material therein, a film containing organic material as a principal constituent, a film containing organic material as a principal constituent, and further containing SiO, in a single-layered structure or a multi-layered structure.

Similarly to the semiconductor device in accordance with the third embodiment, the semiconductor device in accordance with the fourth embodiment makes it possible to enhance adhesion between the first and second alloy wires 5a, 5b and the first and second wire-protection films 6a, 6b, respectively, and present a dual-damascene wire having a high resistance to both electromigration and stress-inducing voids.

Furthermore, since the third and fourth wire-protection films 8a and 8b not containing a metal element are formed on the first and second wire-protection films 6a and 6b, respectively, it is possible to enhance adhesion between the third and fourth wire-protection films 8a and 8b, and interlayer insulating films formed on the third and fourth wire-protection films 8a and 8b.

Though the wire-protection films in the fourth embodiment are designed to have a two-layered structure, the wire-protection films may be designed to have three-, four- or more layered structure.

(Fifth Embodiment)

FIGS. 7A to 7I are cross-sectional views of a semiconductor device to which the semiconductor device in accordance with the first embodiment, illustrated in FIG. 1, is applied, each illustrating a step in the method of fabricating the semiconductor device. Hereinbelow is explained a method of fabricating the semiconductor device with reference to FIGS. 7A to 7I.

First, as illustrated in FIG. 7A, an interlayer insulating film 2 composed of $SiO_2$, a first etching-stopper film 3a composed of SiCN, and a first interlayer insulating film 10a composed of $SiO_2$ are formed in this order on a semiconductor substrate 1 on which a semiconductor element (not illustrated) is formed.

Then, a wire trench 11a is formed in the first interlayer insulating film 10a in accordance with a damascene process.

The first interlayer insulating film 10a may be comprised of, for instance, a $SiO_2$ film, a SiC film, a SiCN film, a HSQ (HydrogenSilsesquioxane) film (for instance, Type 12 (Registered Trademark)), a MSQ (MethylSilsesquioxane) film (for instance, a JSR-LKD (Registered Trademark) film, an ALCAP (Registered Trademark) film, an NCS (Registered Trademark) film, an IPS (Registered Trademark) film or a HOSP (Registered Trademark) film), an organic polymer film (for instance, a SiLK (Registered Trademark) film or a Flare (Registered Trademark) film), a SiOCH film, a SiOC film (for instance, a Black Diamond (Registered Trademark) film, a CORAL (Registered Trademark) film, an AuroraULK (Registered Trademark) film, or an Orion (Registered Trademark) film), an electrically insulating thin film comprised of the above-mentioned films to which organic material is added, a film having a multi-layered structure comprised of a plurality of any one of the above-mentioned films, or any one of the above-mentioned films having a composition and/or a density varying in a depth-wise direction.

The multi-layered structure may be comprised of a two-layered structure comprised of $SiO_2$/AuroraULK (upper layer/lower layer), wherein the $SiO_2$ film is used for protecting the AuroraULK film while CMP is carried out to copper. The multi-layered structure may be comprised of a two-layered structure comprised of Black Diamond/AuroraULK (upper layer/lower layer) in order to reduce a capacity between wires. As an alternative, the multi-layered structure may be comprised of a three-layered structure comprised of $SiO_2$/AuroraULK/$SiO_2$ (upper layer/intermediate layer/lower layer), wherein the upper $SiO_2$ layer is used for protecting the AuroraULK film while CMP is carried out to copper, and the lower $SiO_2$ layer is used as an adhesive layer.

Then, as illustrated in FIG. 7B, there is formed the first barrier metal film 4a in accordance with a sputtering process. The first barrier metal film 4a has a multi-layered structure comprised of Ta/TaN (upper layer/lower layer), and covers therewith an exposed surface of the first interlayer insulating film 10a and a sidewall and a bottom (an exposed surface of the interlayer insulating film 2) of the wire trench 11a.

As illustrated in FIG. 7C, the copper alloy seed film 12 is formed on the first barrier metal film 4a.

The copper alloy seed film 12 is composed of copper/aluminum alloy fabricated by an ionized sputtering process through the use of a copper/aluminum alloy target comprised of a copper target containing aluminum at 1.2 at. %.

Then, a copper film 13 is formed over the copper alloy seed film 12 in accordance with an electrolytic plating process in which the copper alloy seed film 12 is used as an electrode.

Then, aluminum is thermally dispersed into the copper film 13 from the copper alloy seed film 12 composed of copper/aluminum alloy, by carrying out thermal annealing at 350 degrees centigrade for 30 minutes. As a result, as illustrated in FIG. 7D, an alloy film 14 composed of copper/aluminum alloy is formed on the first barrier metal film 4a.

Aluminum contained in the copper alloy seed film 12 is non-uniformly dispersed, resulting in that an aluminum concentration of the alloy film 14 is higher at an area closer to the first barrier metal film 4a.

The aluminum concentration is highest in the vicinity of the first barrier metal film 4a, but even the highest aluminum concentration is equal to or smaller than 1.0 at. %.

Then, as illustrated in FIG. 7E, the alloy film 14 is removed by CMP (Chemical Mechanical Polishing) until the first interlayer insulating film 10a appears. Thus, there is formed the first alloy wire 5a.

Then, the first alloy wire 5a is covered at an upper surface thereof with the first wire-protection film 15a composed of SiCN.

Then, by thermally annealing the product at 350 degrees centigrade for 30 minutes, copper and aluminum contained in the first alloy wire 5a composed of copper/aluminum alloy are dispersed into the first wire-protection film 15a. Thus, as illustrated in FIG. 7F, the first wire-protection film 6a covering an upper surface of the first alloy wire 5a therewith is caused to contain at least one of metal elements contained in the first alloy wire 5a.

A concentration of the metal element contained in the first wire-protection film 6a covering an upper surface of the first alloy wire 5a therewith is equal to or smaller than 1 at. %, and is higher at a location closer to a surface of the first alloy wire 5a.

Aluminum contained in the first alloy wire 5a is demixed by the thermal annealing at an interface between the first wire-protection film 6a and the first alloy wire 5a, resulting in that a concentration of aluminum in the vicinity of the interface is higher than a concentration of aluminum inside of the first alloy wire 5a.

Then, the via interlayer insulating film 7 composed of $SiO_2$, the second etching-stopper film 3b composed of SiCN, and the second interlayer insulating film 10b composed of $SiO_2$ are formed in this order on upper surfaces of the first wire-protection films 6a and 15a.

The second interlayer insulating film 10b has the same structure as that of the first interlayer insulating film 10a.

The via interlayer insulating film 7 may be comprised of, for instance, a $SiO_2$ film, a SiC film, a SiCN film, a HSQ (HydrogenSilsesquioxane) film (for instance, Type 12 (Registered Trademark)), a MSQ (MethylSilsesquioxane) film (for instance, a JSR-LKD (Registered Trademark) film, an ALCAP (Registered Trademark) film, an NCS (Registered Trademark) film, an IPS (Registered Trademark) film or a HOSP (Registered Trademark) film), an organic polymer film (for instance, a SiLK (Registered Trademark) film or a Flare (Registered Trademark) film), a SiOCH film, a SiOC film (for instance, a Black Diamond (Registered Trademark) film, a CORAL (Registered Trademark) film, an AuroraULK (Registered Trademark) film, or an Orion (Registered Trademark) film), an electrically insulating thin film comprised of the above-mentioned films to which organic material is added, a film having a multi-layered structure comprised of a plurality of any one of the above-mentioned films, or any one of the above-mentioned films having a composition and/or a density varying in a depth-wise direction.

Then, as illustrated in FIG. 7G, there are formed a via-hole 11c passing through the second interlayer insulating film 10b, the second etching-stopper film 3b, the via interlayer insulating film 7 and the first wire-protection film 6a, and a wire trench 11b passing through the second interlayer insulating film 10b, in accordance with a dual damascene process. The wire trench 11b is larger in diameter than the via-hole 11c.

Then, as illustrated in FIG. 7H, the second barrier metal film 4b having a multi-layered structure comprised of Ta/TaN (upper layer/lower layer) is formed in accordance with a sputtering process so as to cover the via-hole 11c and the wire trench 11b therewith.

Then, similarly to the first alloy wire 5a formed in the wire trench 11a, the second alloy wire 5b is formed in the via-hole 11c and the wire trench 11b.

Then, the second alloy wire 5b and the second interlayer insulating film 10b are covered at upper surfaces thereof with the second wire-protection film 15b composed of SiCN.

Then, copper and aluminum is thermally dispersed into the second wire-protection film 15b from the second alloy wire 5b composed of copper/aluminum alloy, by carrying out thermal annealing at 350 degrees centigrade for 30 minutes. As a result, as illustrated in FIG. 7I, the second wire-protection film 6b covering an upper surface of the second alloy wire 5b therewith is caused to contain at least one of metal elements contained in the second alloy wire 5b.

A concentration of the metal element contained in the second wire-protection film 6b covering an upper surface of the second alloy wire 5b therewith is equal to or smaller than 1 at. %, and is higher at a location closer to a surface of the second alloy wire 5b.

Similarly to the first alloy wire 5a, a concentration of aluminum contained in the second alloy wire 5b is higher at a location closer to the second barrier metal film 4b.

Furthermore, a concentration of aluminum in the vicinity of an interface between the second wire-protection film 6b and the second alloy wire 5b is higher than a concentration of aluminum inside of the second alloy wire 5b.

A concentration of aluminum contained in the second alloy wire 5b is highest in the vicinity of the second barrier metal film 4b, but even the highest aluminum concentration is equal to or smaller than 1.0 at. %.

The semiconductor device fabricated in accordance with the above-mentioned steps makes it possible to enhance adhesion between the first and second alloy wires 5a, 5b and the first and second wire-protection films 6a, 6b, respectively, ensuring enhancement in a resistance to both electromigration and stress-inducing voids.

(Sixth Embodiment)

Figure 8:
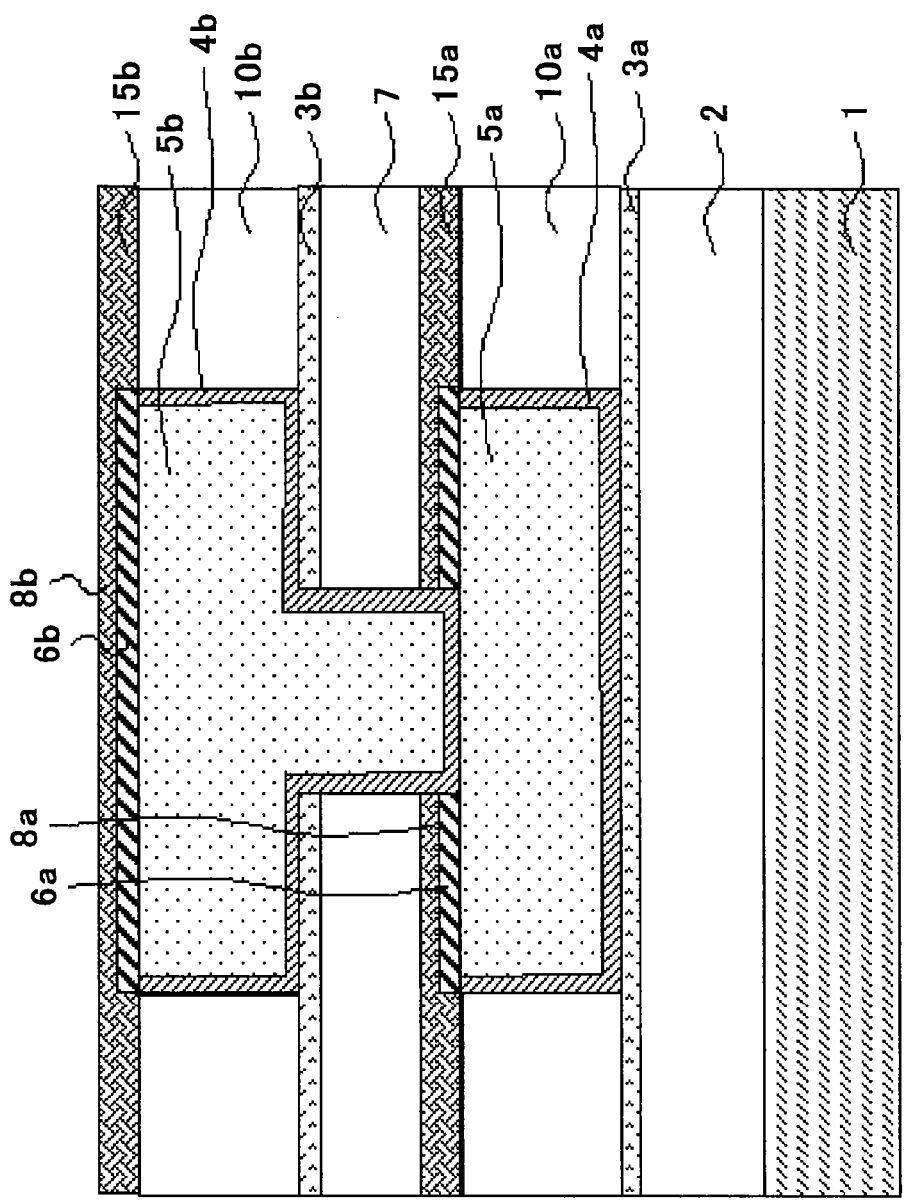
FIG. 8 is a cross-sectional view of a first variant of the semiconductor device in accordance with the first embodiment, fabricated in accordance with the method illustrated in FIGS. 7A to 7I.

FIG. 8 is a cross-sectional view of a first variant of the semiconductor device fabricated in accordance with the method illustrated in FIGS. 7A to 7I.

In the semiconductor device in accordance with the first variant, an area into which the metal element is dispersed is formed shorter than the first and second wire-protection films 15a and 15b in the steps illustrated in FIGS. 7F and 7I, that is, the steps of dispersing copper and aluminum contained in the first and second alloy wires 5a and 5b both composed of copper/aluminum alloy, into the first and second wire-protection films 15a and 15b, respectively.

Thus, as illustrated in FIG. 8, on the first and second wire-protection films 6a and 6b containing at least one of metal elements contained in the first and second alloy wires 5a and 5b, there are formed the third and fourth wire-protection films 8a and 8b both not containing the at least one of metal elements. It is possible to have a structure in which interlayer insulating films formed on the third and fourth wire-protection films 8a and 8b do not make direct contact with the first and second wire-protection films 6a and 6b containing at least one of metal elements contained in the first and second alloy wires 5a and 5b.

As an alternative, the above-mentioned structure can be obtained by forming the third and fourth wire-protection films 8a and 8b similar to the first and second wire-protection films 15a and 15b, on the first and second wire-protection films 6a and 6b, subsequently to the step of dispersing copper and aluminum contained in the first and second alloy wires 5a and 5b both composed of copper/aluminum alloy, into the first and second wire-protection films 15a and 15b.

The semiconductor device fabricated in accordance with the first variant makes it possible to enhance adhesion between the first and second alloy wires 5a, 5b and the first and second wire-protection films 6a, 6b, respectively, ensuring enhancement in a resistance to both electromigration and stress-inducing voids.

In addition, in the semiconductor device fabricated in accordance with the first variant, since the third and fourth wire-protection films 8a and 8b both not containing the metal element are formed on the first and second wire-protection films 6a and 6b covering therewith upper surfaces of the first and second alloy wires 5a and 5b both containing the metal element, the resultant wire structure could have high adhesion between the third and fourth wire-protection films 8a and 8b and interlayer insulating films formed on the third and fourth wire-protection films 8a and 8b.

(Seventh Embodiment)

Figure 9:
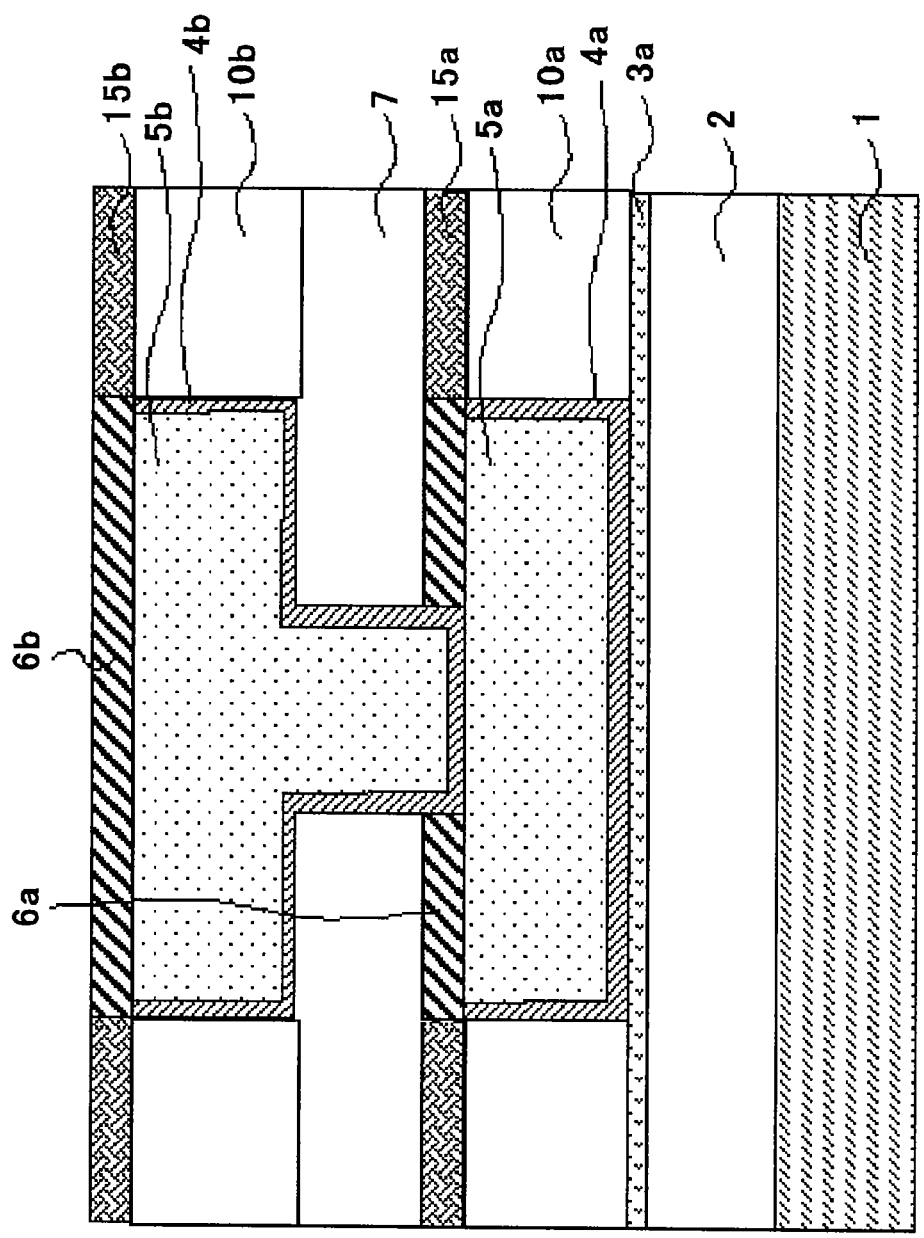
FIG. 9 is a cross-sectional view of a second variant of the semiconductor device in accordance with the first embodiment, fabricated in accordance with the method illustrated in FIGS. 7A to 7I.

FIG. 9 is a cross-sectional view of a second variant of the semiconductor device fabricated in accordance with the method illustrated in FIGS. 7A to 7I.

In the second variant, there is obtained the semiconductor device having the structure illustrated in FIG. 9 by not using the second etching-stopper film 3b in the step illustrated in FIG. 7G, that is, the step of forming the via-hole 11c and the wire trench 11b in accordance with a dual damascene process.

The semiconductor device in accordance with the second variant makes it possible to enhance a resistance to both electromigration and stress-inducing voids, and reduce an effective dielectric constant of a wire to thereby reduce a parasitic capacity between wires.

(Eighth Embodiment)

The semiconductor device in accordance with the eighth embodiment is comprised of a third variant of the semiconductor device fabricated in accordance with the method illustrated in FIGS. 7A to 7I.

The semiconductor device in accordance with the third variant has the same structure as that of the semiconductor device having the cross-section illustrated in FIG. 7I, and is designed to include the first and second wire-protection films 15a and 15b both of which are comprised of a DVS-BCB (divinylsiloxane-benzocyclobutene) film composed in accordance with a plasma polymerization process.

The semiconductor device in accordance with the second variant makes it possible to enhance a resistance to both electromigration and stress-inducing voids, and reduce an effective dielectric constant of a wire to thereby reduce a parasitic capacity between wires.

(Ninth Embodiment)

Figure 10:
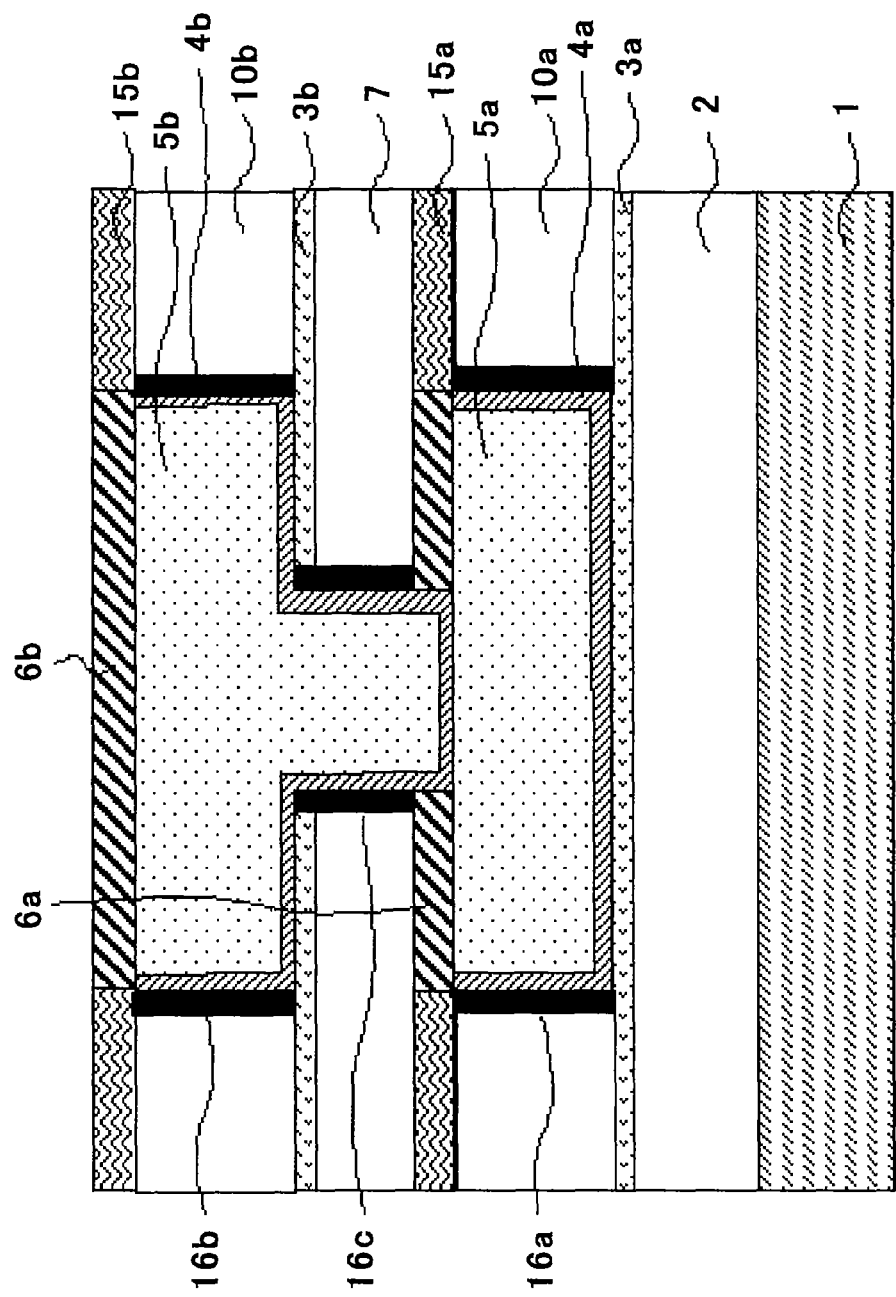
FIG. 10 is a cross-sectional view of a fourth variant of the semiconductor device in accordance with the first embodiment, fabricated in accordance with the method illustrated in FIGS. 7A to 7I.

FIG. 10 is a cross-sectional view of a fourth variant of the semiconductor device fabricated in accordance with the method illustrated in FIGS. 7A to 7I.

In the semiconductor device in accordance with the fourth variant, in the steps illustrated in FIGS. 7A and 7G, that is, the steps of forming the wire trench 11a, the via-hole 11c and the wire trench 11b in accordance with a damascene process, sidewall-protection films 16a, 16b and 16c all comprised of a DVS-BCB (divinylsiloxane-benzocyclobutene) film are formed in accordance with a plasma polymerization process for protecting sidewalls of the wire trench 11a, the via-hole 11c and the wire trench 11b.

Thus, there is obtained the semiconductor device having the structure illustrated in FIG. 10.

The semiconductor device in accordance with the fourth variant makes it possible to enhance a resistance to both electromigration and stress-inducing voids, and reduce current leakage between wires by virtue of the protection of sidewalls of the interlayer insulating films. In particular, the current leakage is significantly reduced when the first and second wire-protection films 10a and 10b or the via interlayer insulating film 7 is comprised at least partially of a porous film such as AuroraULK film.

(Tenth Embodiment)

Figure 11:
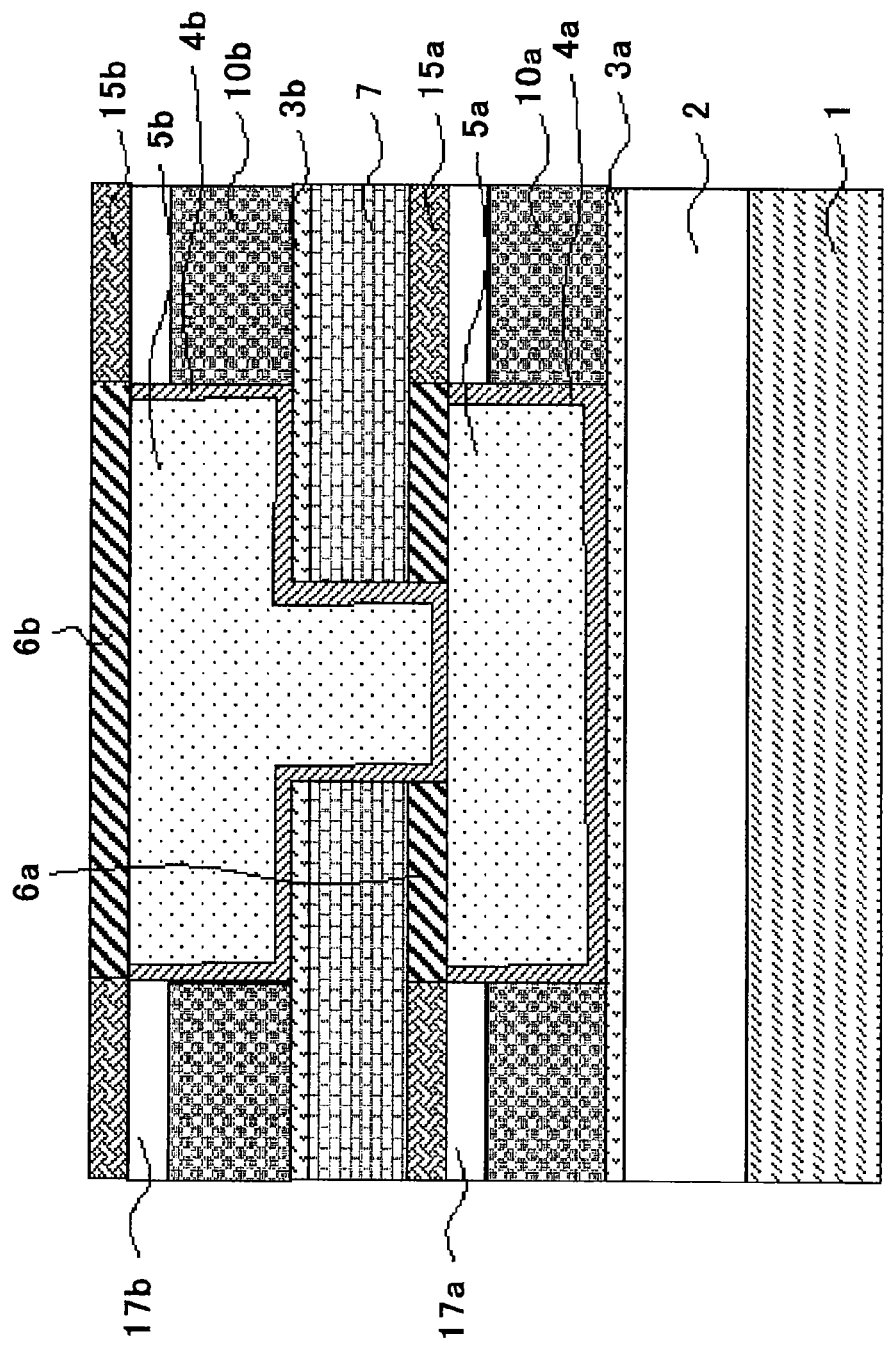
FIG. 11 is a cross-sectional view of a fifth variant of the semiconductor device in accordance with the first embodiment, fabricated in accordance with the method illustrated in FIGS. 7A to 7I.

FIG. 11 is a cross-sectional view of a fifth variant of the semiconductor device fabricated in accordance with the method illustrated in FIGS. 7A to 7I.

The semiconductor device in accordance with the fifth variant has the same structure as that of the semiconductor device having the cross-section illustrated in FIG. 7I, and is designed to include the first and second interlayer insulating films 10a and 10b having a two-layered structure comprised of an AuroraULK film, which is a porous film, and a wire layer hard mask composed of $SiO_2$ (the wire layer hard mask is indicated with reference numbers 17a and 17b in FIG. 11), and further include the via interlayer insulating film 7 composed of Black Diamond.

The semiconductor device in accordance with the fifth variant makes it possible to enhance a resistance to both electromigration and stress-inducing voids, and reduce an effective dielectric constant of a wire to thereby reduce a parasitic capacity between wires through the use of an AuroraULK film and a Black Diamond film both having a smaller dielectric constant than a dielectric constant of a $SiO_2$ film.

(Eleventh Embodiment)

The semiconductor device in accordance with the eleventh embodiment has the same structure as that of the semiconductor device in accordance with the fifth variant as the tenth embodiment except that the wire layer hard masks 17a and 17b are comprised of a Black Diamond film, and the via interlayer insulating film 7 is comprised of an AuroraULK film.

The semiconductor device in accordance with the eleventh embodiment makes it possible to enhance a resistance to both electromigration and stress-inducing voids, and reduce an effective dielectric constant of a wire to thereby reduce a parasitic capacity between wires.

(Twelfth Embodiment)

Figure 12:
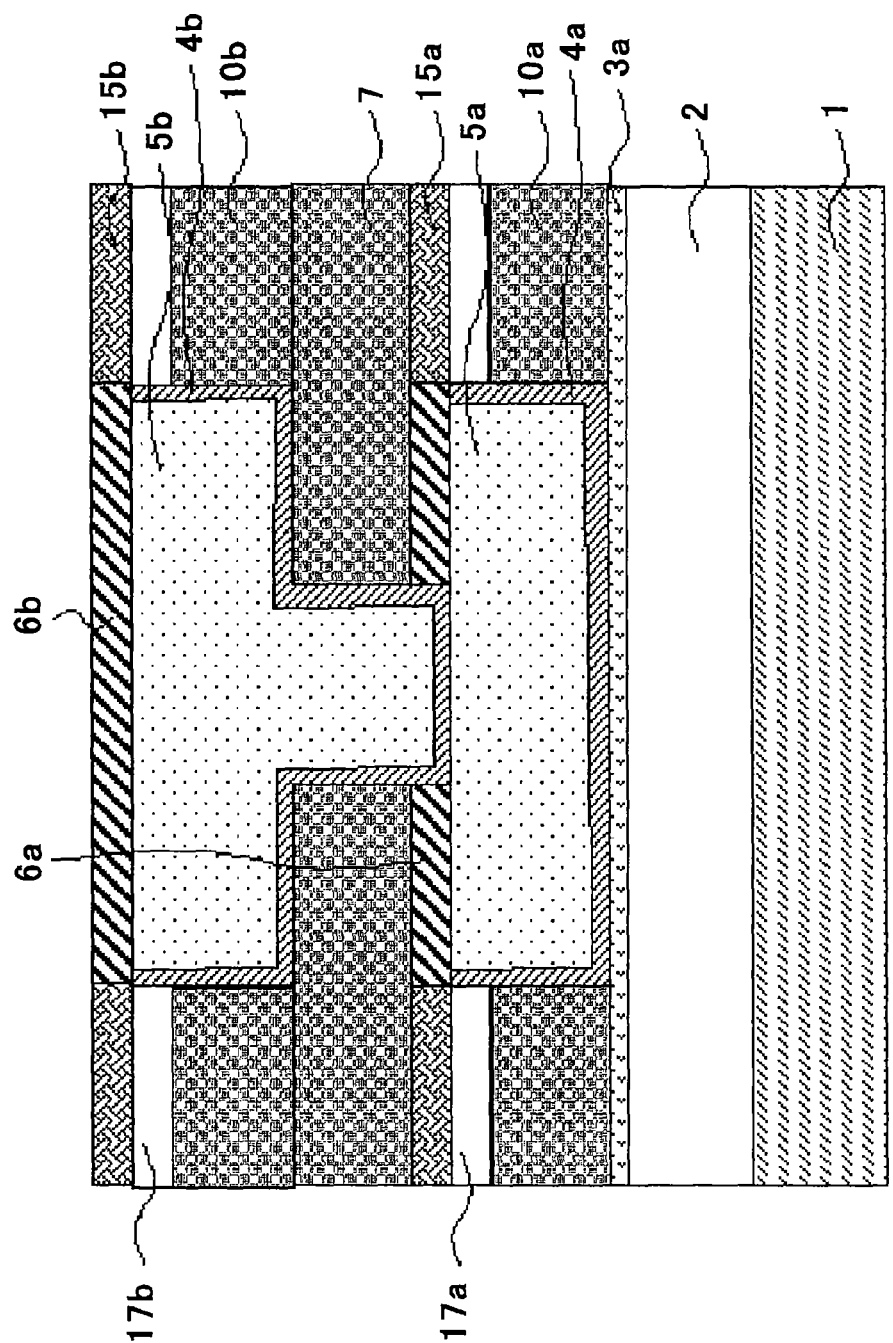
FIG. 12 is a cross-sectional view of a sixth variant of the semiconductor device in accordance with the first embodiment, fabricated in accordance with the method illustrated in FIGS. 7A to 7I.

FIG. 12 is a cross-sectional view of a sixth variant of the semiconductor device fabricated in accordance with the method illustrated in FIGS. 7A to 7I.

The semiconductor device in accordance with the twelfth embodiment is comprised of a variant of the semiconductor device in accordance with the seventh embodiment, illustrated in FIG. 9.

The semiconductor device in accordance with the twelfth embodiment has the same structure as that of the seventh embodiment except that the first and second interlayer insulating films 4a and 4b have a two-layered structure comprised of an AuroraULK film, which is a porous film, and a wire layer hard mask composed of $SiO_2$ (the wire layer hard mask is indicated with reference numbers 17a and 17b in FIG. 12), and the via interlayer insulating film 7 is comprised of an AuroraULK film.

The semiconductor device in accordance with the twelfth embodiment makes it possible to enhance a resistance to both electromigration and stress-inducing voids, and reduce an effective dielectric constant of a wire to thereby reduce a parasitic capacity between wires (Thirteenth Embodiment)

Figure 13:
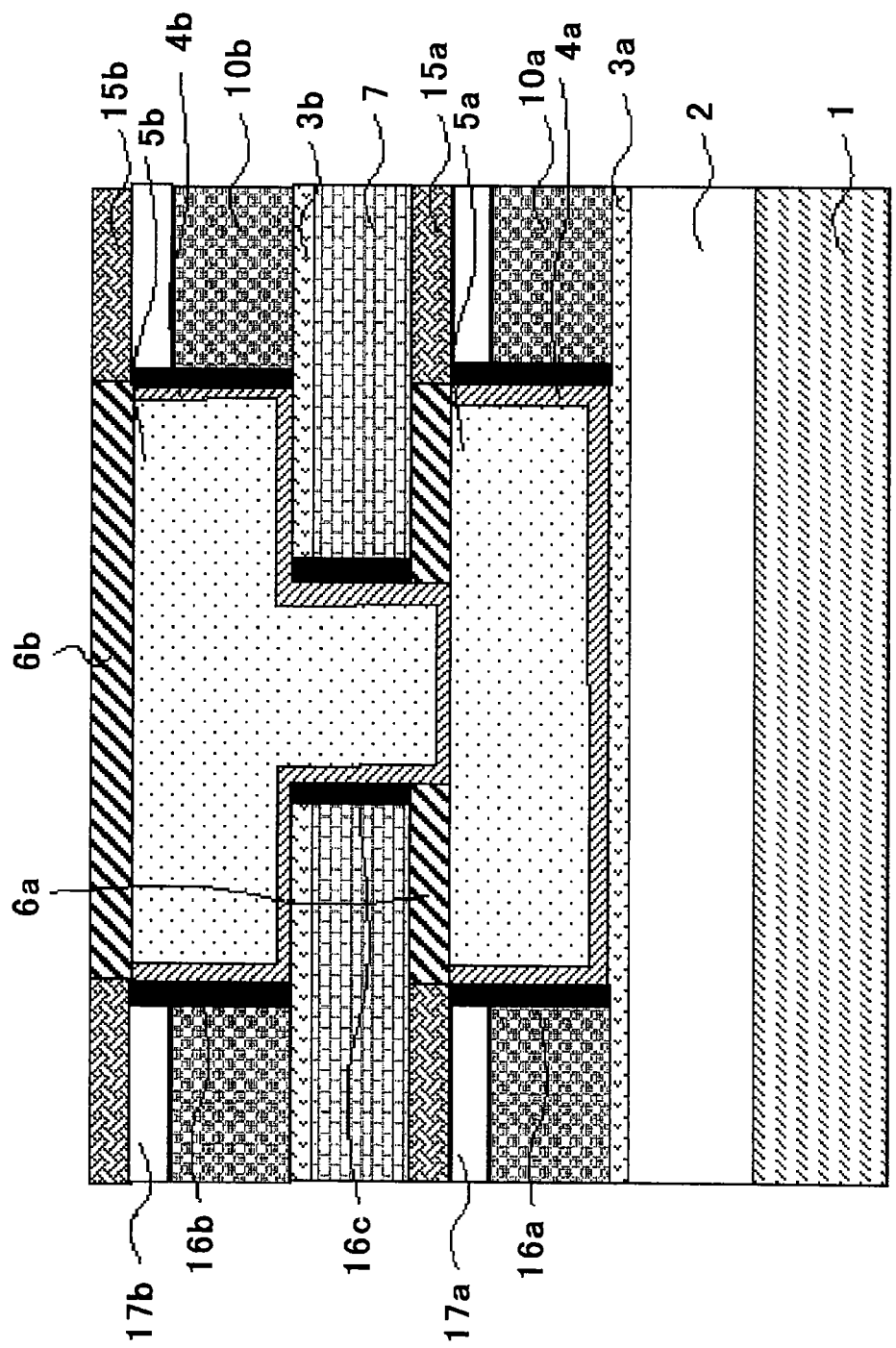
FIG. 13 is a cross-sectional view of a seventh variant of the semiconductor device in accordance with the first embodiment, fabricated in accordance with the method illustrated in FIGS. 7A to 7I.

FIG. 13 is a cross-sectional view of a seventh variant of the semiconductor device fabricated in accordance with the method illustrated in FIGS. 7A to 7I.

The semiconductor device in accordance with the thirteenth embodiment is comprised of a variant of the semiconductor device in accordance with the tenth embodiment, illustrated in FIG. 11.

The semiconductor device in accordance with the thirteenth embodiment has the same structure as that of the tenth embodiment illustrated in FIG. 11 except that sidewalls of wires and vias are covered with sidewall-protection films 16a, 16b and 16c comprised of a DVS-BCB (divinylsiloxane-benzocyclobutene) film formed in accordance with a plasma polymerization process.

The semiconductor device in accordance with the thirteenth embodiment makes it possible to enhance a resistance to both electromigration and stress-inducing voids, protect sidewalls of interlayer insulating films, and reduce current leakage between wires due to the protection of an interface between an interlayer insulating film and a hard mask.

(Fourteenth Embodiment)

FIGS. 14A to 14I are cross-sectional views of a semiconductor device to which the semiconductor device in accordance with the third embodiment, illustrated in FIG. 3, is applied, each illustrating a step in the method of fabricating the semiconductor device. Hereinbelow is explained a method of fabricating the semiconductor device with reference to FIGS. 14A to 14I.

First, as illustrated in FIG. 14A, an interlayer insulating film 2 composed of $SiO_2$, a first etching-stopper film 3a composed of SiCN, and a first interlayer insulating film 10a composed of $SiO_2$ are formed in this order on a semiconductor substrate 1 on which a semiconductor element (not illustrated) is formed.

Then, a wire trench 11a is formed in the first interlayer insulating film 10a in accordance with a damascene process.

The first interlayer insulating film 10a may be comprised of, for instance, a $SiO_2$ film, a SiC film, a SiCN film, a HSQ (HydrogenSilsesquioxane) film (for instance, Type 12 (Registered Trademark)), a MSQ (MethylSilsesquioxane) film (for instance, a JSR-LKD (Registered Trademark) film, an ALCAP (Registered Trademark) film, an NCS (Registered Trademark) film, an FPS (Registered Trademark) film or a HOSP (Registered Trademark) film), an organic polymer film (for instance, a SiLK (Registered Trademark) film or a Flare (Registered Trademark) film), a SiOCH film, a SiOC film (for instance, a Black Diamond (Registered Trademark) film, a CORAL (Registered Trademark) film, an AuroraULK (Registered Trademark) film, or an Orion (Registered Trademark) film), an electrically insulating thin film comprised of the above-mentioned films to which organic material is added, a film having a multi-layered structure comprised of a plurality of any one of the above-mentioned films, or any one of the above-mentioned films having a composition and/or a density varying in a depth-wise direction.

The multi-layered structure may be comprised of a two-layered structure comprised of $SiO_2$/AuroraULK (upper layer/lower layer), wherein the $SiO_2$ film is used for protecting the AuroraULK film while CMP is carried out to copper. The multi-layered structure may be comprised of a two-layered structure comprised of Black Diamond/AuroraULK (upper layer/lower layer) in order to reduce a capacity between wires. As an alternative, the multi-layered structure may be comprised of a three-layered structure comprised of $SiO_2$/AuroraULK/$SiO_2$ (upper layer/intermediate layer/lower layer), wherein the upper $SiO_2$ layer is used for protecting the AuroraULK film while CMP is carried out to copper, and the lower $SiO_2$ layer is used as an adhesive layer.

Then, as illustrated in FIG. 14B, there is formed the first barrier metal film 4a in accordance with a sputtering process. The first barrier metal film 4a has a multi-layered structure comprised of Ta/TaN (upper layer/lower layer), and covers therewith an exposed surface of the first interlayer insulating film 10a and a sidewall and a bottom (an exposed surface of the interlayer insulating film 2) of the wire trench 11a.

As illustrated in FIG. 14C, the copper alloy seed film 12 is formed on the first barrier metal film 4a.

The copper alloy seed film 12 is composed of copper/aluminum alloy fabricated by an ionized sputtering process through the use of a copper/aluminum alloy target comprised of a copper target containing aluminum at 1.2 at. %.

Then, a copper film 13 is formed over the copper alloy seed film 12 in accordance with an electrolytic plating process in which the copper alloy seed film 12 is used as an electrode.

Then, aluminum is thermally dispersed into the copper film 13 from the copper alloy seed film 12 composed of copper/aluminum alloy, by carrying out thermal annealing at 350 degrees centigrade for 30 minutes. As a result, as illustrated in FIG. 14D, an alloy film 14 composed of copper/aluminum alloy is formed on the first barrier metal film 4a.

Aluminum contained in the copper alloy seed film 12 is non-uniformly dispersed, resulting in that an aluminum concentration of the alloy film 14 is higher at an area closer to the first barrier metal film 4a.

The aluminum concentration is highest in the vicinity of the first barrier metal film 4a, but even the highest aluminum concentration is equal to or smaller than 1.0 at. %.

Then, as illustrated in FIG. 14E, the alloy film 14 is removed by CMP (Chemical Mechanical Polishing) until the first interlayer insulating film 10a appears. Thus, there is formed the first alloy wire 5a.

Then, the first alloy wire 5a is covered at an upper surface thereof with the first wire-protection film 15a composed of SiCN.

Then, by thermally annealing the product at 350 degrees centigrade for 30 minutes, copper and aluminum contained in the first alloy wire 5a composed of copper/aluminum alloy are dispersed into the first wire-protection film 15a. Thus, as illustrated in FIG. 14F, the first wire-protection film 6a covering an upper surface of the first alloy wire 5a therewith is caused to contain at least one of metal elements contained in the first alloy wire 5a.

A concentration of the metal element contained in the first wire-protection film 6a covering an upper surface of the first alloy wire 5a therewith is equal to or smaller than 1 at. %, and is higher at a location closer to a surface of the first alloy wire 5a.

Aluminum contained in the first alloy wire 5a is demixed by the thermal annealing at an interface between the first wire-protection film 6a and the first alloy wire 5a, resulting in that a concentration of aluminum in the vicinity of the interface is higher than a concentration of aluminum inside of the first alloy wire 5a.

Then, the via interlayer insulating film 7 composed of $SiO_2$ is formed on upper surfaces of the first wire-protection films 6a and 15a.

The via interlayer insulating film 7 may be comprised of, for instance, a $SiO_2$ film, a SiC film, a SiCN film, a HSQ (HydrogenSilsesquioxane) film (for instance, Type 12 (Registered Trademark)), a MSQ (MethylSilsesquioxane) film (for instance, a JSR-LKD (Registered Trademark) film, an ALCAP (Registered Trademark) film, an NCS (Registered Trademark) film, an IPS (Registered Trademark) film or a HOSP (Registered Trademark) film), an organic polymer film (for instance, a SiLK (Registered Trademark) film or a Flare (Registered Trademark) film), a SiOCH film, a SiOC film (for instance, a Black Diamond (Registered Trademark) film, a CORAL (Registered Trademark) film, an AuroraULK (Registered Trademark) film, or an Orion (Registered Trademark) film), an electrically insulating thin film comprised of the above-mentioned films to which organic material is added, a film having a multi-layered structure comprised of a plurality of any one of the above-mentioned films, or any one of the above-mentioned films having a composition and/or a density varying in a depth-wise direction.

Then, as illustrated in FIG. 14Q there is formed a via-hole 11c passing through the via interlayer insulating film 7 and the first wire-protection film 6a and reaching the first alloy wire 5a.

Then, as illustrated in FIG. 14H, a third barrier metal film 4c having a two-layered structure comprised of Ta/TaN (upper layer/lower layer) is formed on an inner surface of the via-hole 11c.

Then, an alloy via 5c is formed in the via-hole 11c, being surrounded by the third barrier metal 4c.

The steps of forming the alloy via 5c are identical with the steps of forming the first alloy wire 5a in the wire trench 11a.

Then, as illustrated in FIG. 14H, a second etching-stopper film 3b and the second interlayer insulating film 10b are formed in this order on the alloy via 5c and the via interlayer insulating film 7.

Then, there is formed a via-hole (not illustrated) passing through both the second etching-stopper film 3b and the second interlayer insulating film 10b, and reaching the alloy via 5c and the via interlayer insulating film 7.

Then, a second barrier metal film 4b having a two-layered structure comprised of Ta/TaN (upper layer/lower layer) is formed on an inner surface of the via-hole.

Then, a second alloy wire 5b is formed in the via-hole, being surrounded by the second barrier metal 4b. The steps of forming the second alloy wire 5b are identical with the steps of forming the first alloy wire 5a in the wire trench 11a.

The second interlayer insulating film 10b has the same structure as that of the first interlayer insulating film 10a.

Then, the second alloy wire 5b is covered at an upper surface thereof with the second wire-protection film 15b composed of SiCN.

Then, copper and aluminum is thermally dispersed into the second wire-protection film 15b from the second alloy wire 5b composed of copper/aluminum alloy, by carrying out thermal annealing at 350 degrees centigrade for 30 minutes. As a result, as illustrated in FIG. 14I, the second wire-protection film 6b covering an upper surface of the second alloy wire 5b therewith is caused to contain at least one of metal elements contained in the second alloy wire 5b.

A concentration of the metal element contained in the second wire-protection film 6b covering an upper surface of the second alloy wire 5b therewith is equal to or smaller than 1 at. %, and is higher at a location closer to a surface of the second alloy wire 5b.

Similarly to the first alloy wire 5a, a concentration of aluminum contained in the second alloy wire 5b is higher at a location closer to the second barrier metal film 4b.

Furthermore, a concentration of aluminum in the vicinity of an interface between the second wire-protection film 6b and the second alloy wire 5b is higher than a concentration of aluminum inside of the second alloy wire 5b.

A concentration of aluminum contained in the second alloy wire 5b is highest in the vicinity of the second barrier metal film 4b, but even the highest aluminum concentration is equal to or smaller than 1.0 at. %.

The semiconductor device fabricated in accordance with the above-mentioned steps makes it possible to enhance adhesion between the first and second alloy wires 5a, 5b and the first and second wire-protection films 6a, 6b, respectively, ensuring enhancement in a resistance to both electromigration and stress-inducing voids.

(Fifteenth Embodiment)

Figure 15:
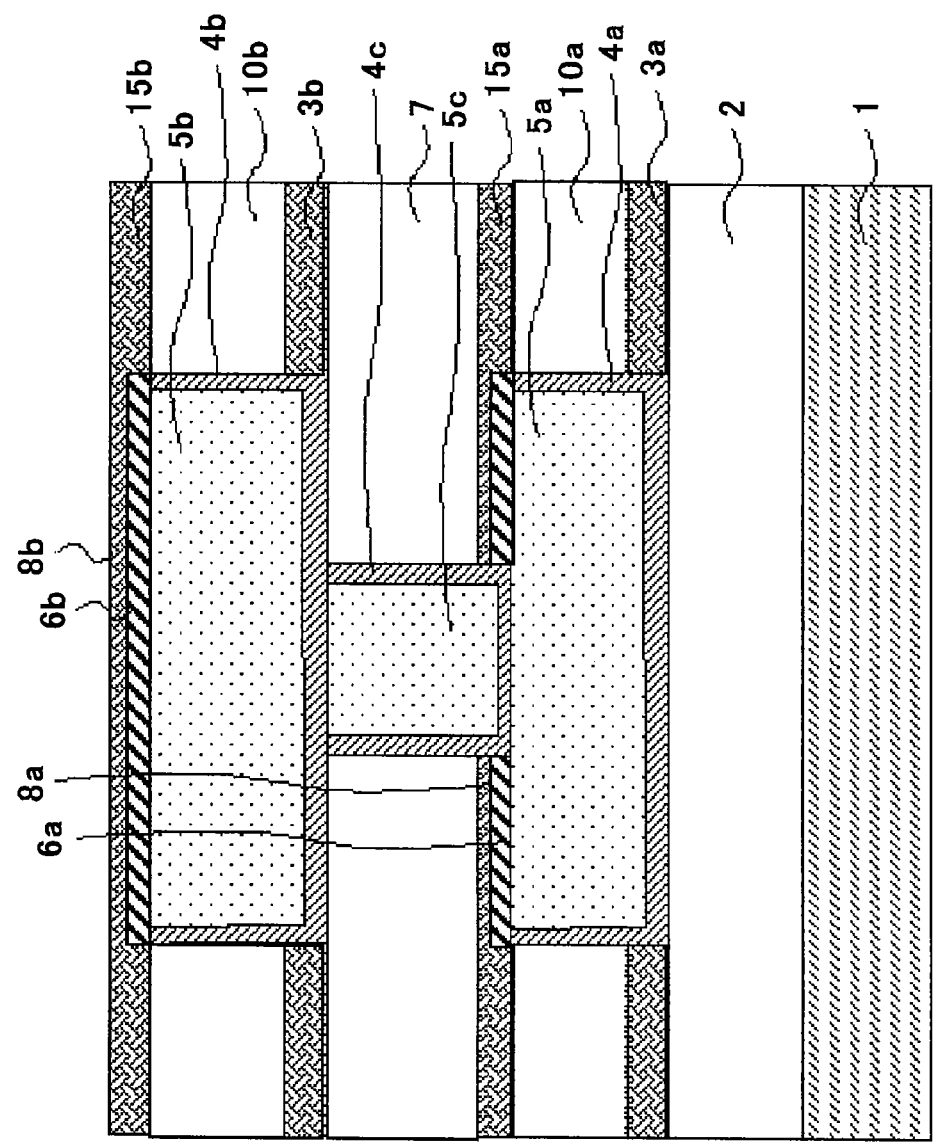
FIG. 15 is a cross-sectional view of a first variant of the semiconductor device in accordance with the first embodiment, fabricated in accordance with the method illustrated in FIGS. 14A to 14I.

FIG. 15 is a cross-sectional view of a first variant of the semiconductor device fabricated in accordance with the method illustrated in FIGS. 14A to 14I.

In the semiconductor device in accordance with the first variant, an area into which the metal element is dispersed is formed shorter than the first and second wire-protection films 15a and 15b in the steps illustrated in FIGS. 14(f) and 14(i), that is, the steps of dispersing copper and aluminum contained in the first and second alloy wires 5a and 5b both composed of copper/aluminum alloy, into the first and second wire-protection films 15a and 15b, respectively.

Thus, as illustrated in FIG. 15, on the first and second wire-protection films 6a and 6b containing at least one of metal elements contained in the first and second alloy wires 5a and 5b, there are formed the third and fourth wire-protection films 8a and 8b both not containing the at least one of metal elements. It is possible to have a structure in which interlayer insulating films formed on the third and fourth wire-protection films 8a and 8b do not make direct contact with the first and second wire-protection films 6a and 6b containing at least one of metal elements contained in the first and second alloy wires 5a and 5b.

As an alternative, the above-mentioned structure can be obtained by forming the third and fourth wire-protection films 8a and 8b similar to the first and second wire-protection films 15a and 15b, on the first and second wire-protection films 6a and 6b, subsequently to the step of dispersing copper and aluminum contained in the first and second alloy wires 5a and 5b both composed of copper/aluminum alloy, into the first and second wire-protection films 15a and 15b.

Similarly to the fourteenth embodiment, the semiconductor device fabricated in accordance with the first variant makes it possible to enhance adhesion between the first and second alloy wires 5a, 5b and the first and second wire-protection films 6a, 6b, respectively, ensuring enhancement in a resistance to both electromigration and stress-inducing voids.

In addition, in the semiconductor device fabricated in accordance with the first variant, since the third and fourth wire-protection films 8a and 8b both not containing the metal element are formed on the first and second wire-protection films 6a and 6b covering therewith upper surfaces of the first and second alloy wires 5a and 5b both containing the metal element, the resultant wire structure could have high adhesion between the third and fourth wire-protection films 8a and 8b and interlayer insulating films formed on the third and fourth wire-protection films 8a and 8b.

(Sixteenth Embodiment)

Figure 16:
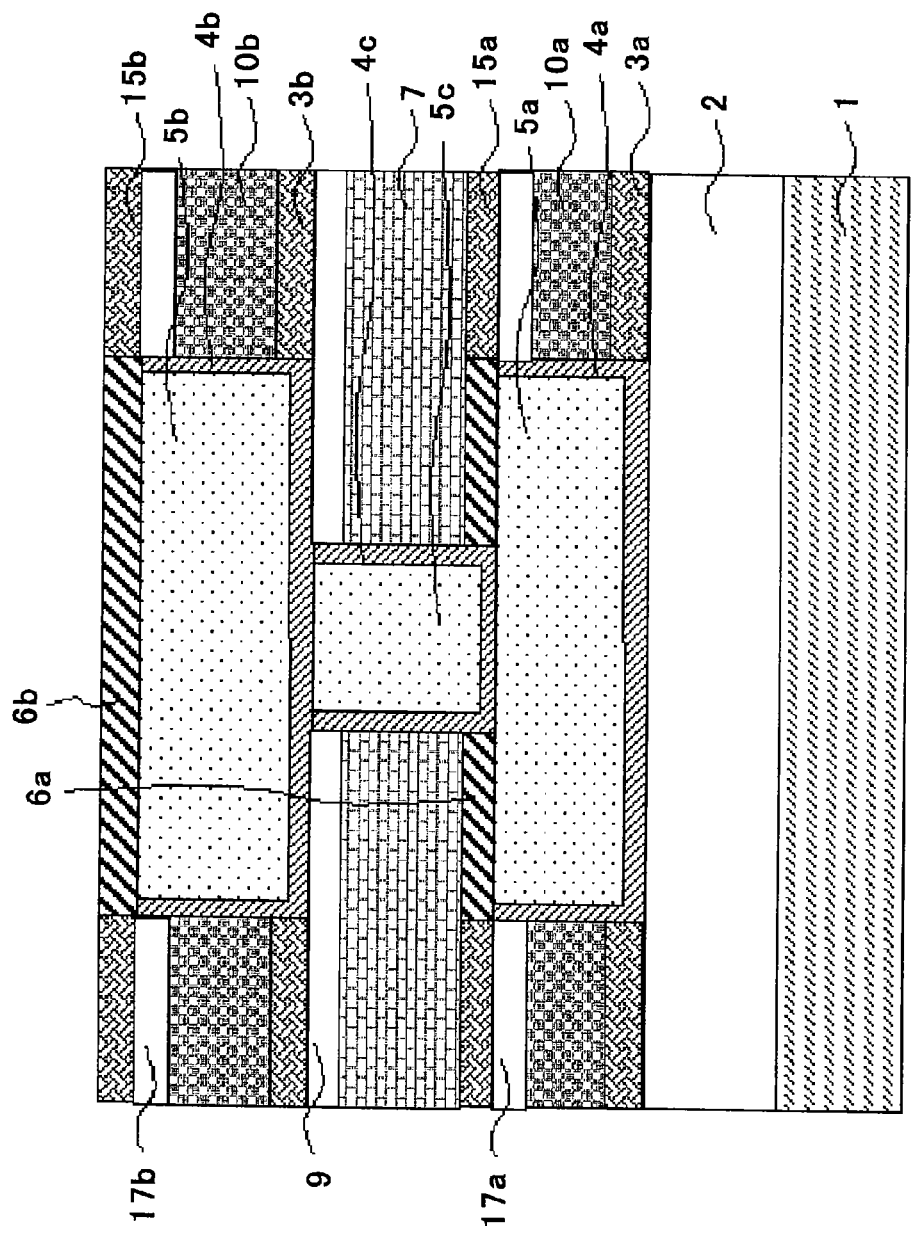
FIG. 16 is a cross-sectional view of a second variant of the semiconductor device in accordance with the first embodiment, fabricated in accordance with the method illustrated in FIGS. 14A to 14I.

FIG. 16 is a cross-sectional view of a second variant of the semiconductor device fabricated in accordance with the method illustrated in FIGS. 14A to 14I.

The semiconductor device in accordance with the fifth variant has the same structure as that of the semiconductor device having the cross-section illustrated in FIG. 14I, and is designed to include the first and second interlayer insulating films 10a and 10b having a two-layered structure comprised of an AuroraULK film, which is a porous film, and a wire layer hard mask composed of $SiO_2$ (the wire layer hard mask is indicated with reference numbers 17a and 17b in FIG. 16), and further include the via interlayer insulating film 7 composed of Black Diamond.

The semiconductor device in accordance with the fifth variant makes it possible to enhance a resistance to both electromigration and stress-inducing voids, and reduce an effective dielectric constant of a wire to thereby reduce a parasitic capacity between wires through the use of an AuroraULK film and a Black Diamond film both having a smaller dielectric constant than a dielectric constant of a $SiO_2$ film.

(Seventeenth Embodiment)

Figure 17:
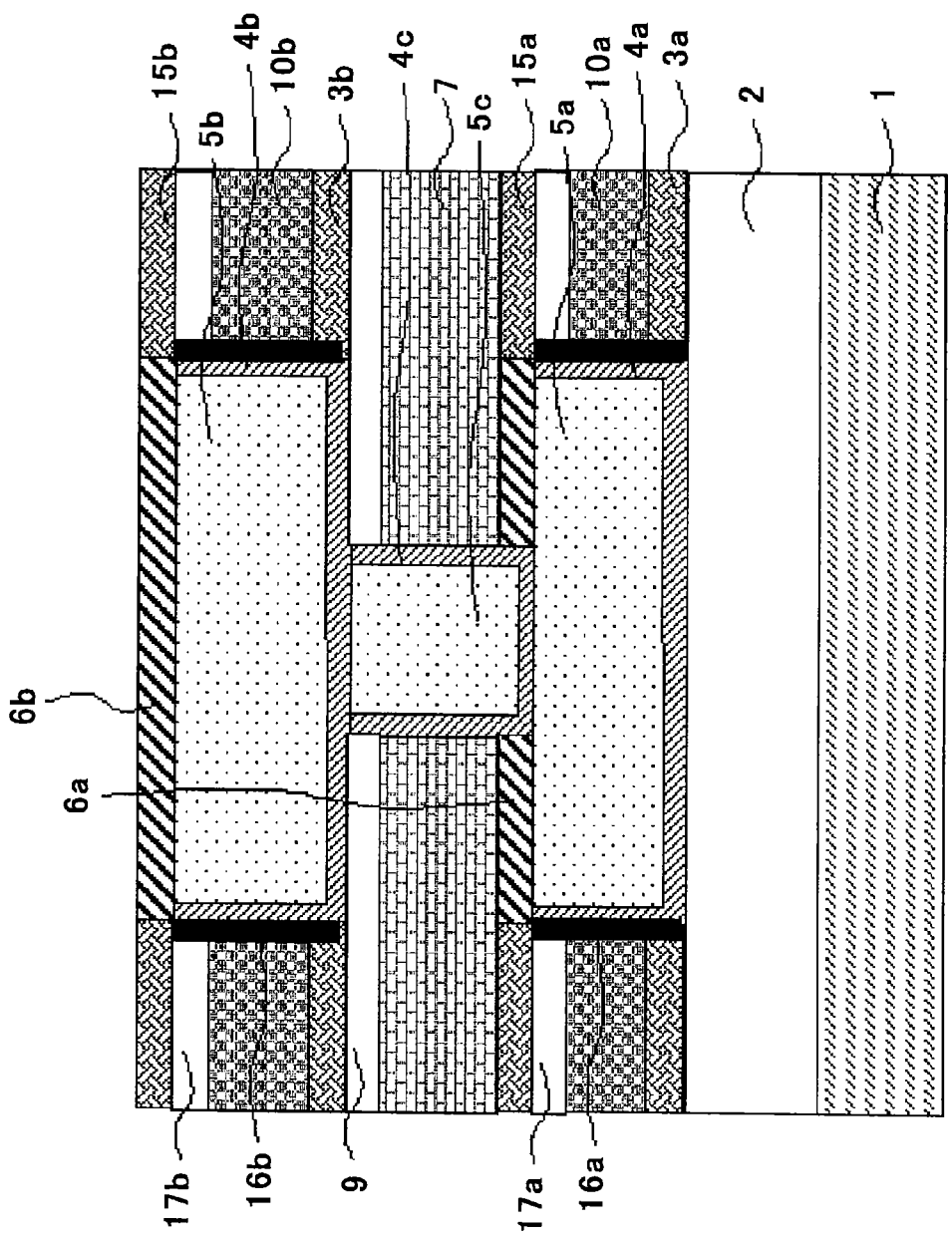
FIG. 17 is a cross-sectional view of a third variant of the semiconductor device in accordance with the first embodiment, fabricated in accordance with the method illustrated in FIGS. 14A to 14I.

FIG. 17 is a cross-sectional view of a third variant of the semiconductor device fabricated in accordance with the method illustrated in FIGS. 14A to 14I.

The semiconductor device in accordance with the seventeenth embodiment has the same structure as that of the semiconductor device in FIG. 16 except that sidewalls of the first and second alloy wires 5a and 5b are covered with sidewall-protection films 16a, 16b and 16c comprised of a DVS-BCB (divinylsiloxane-benzocyclobutene) film formed in accordance with a plasma polymerization process.

The semiconductor device in accordance with the seventeenth embodiment makes it possible to enhance a resistance to both electromigration and stress-inducing voids, protect sidewalls of interlayer insulating films, and reduce current leakage between wires due to the protection of an interface between an interlayer insulating film and a hard mask.

(Eighteenth Embodiment)

FIGS. 18A to 18I are includes cross-sectional views of a semiconductor device to which the semiconductor device in accordance with the first embodiment, illustrated in FIG. 1, is applied, each illustrating a step in the method of fabricating the semiconductor device. Hereinbelow is explained a method of fabricating the semiconductor device with reference to FIGS. 18A to 18I.

First, as illustrated in FIG. 18A, an interlayer insulating film 2 composed of $SiO_2$, a first etching-stopper film 3a composed of SiCN, and a first interlayer insulating film 10a composed of $SiO_2$ are formed in this order on a semiconductor substrate 1 on which a semiconductor element (not illustrated) is formed.

Then, a wire trench 11a is formed in the first interlayer insulating film 10a in accordance with a damascene process.

The first interlayer insulating film 10a may be comprised of, for instance, a $SiO_2$ film, a SiC film, a SiCN film, a HSQ (HydrogenSilsesquioxane) film (for instance, Type 12 (Registered Trademark)), a MSQ (MethylSilsesquioxane) film (for instance, a JSR-LKD (Registered Trademark) film, an ALCAP (Registered Trademark) film, an NCS (Registered Trademark) film, an IPS (Registered Trademark) film or a HOSP (Registered Trademark) film), an organic polymer film (for instance, a SiLK (Registered Trademark) film or a Flare (Registered Trademark) film), a SiOCH film, a SiOC film (for instance, a Black Diamond (Registered Trademark) film, a CORAL (Registered Trademark) film, an AuroraULK (Registered Trademark) film, or an Orion (Registered Trademark) film), an electrically insulating thin film comprised of the above-mentioned films to which organic material is added, a film having a multi-layered structure comprised of a plurality of any one of the above-mentioned films, or any one of the above-mentioned films having a composition and/or a density varying in a depth-wise direction.

The multi-layered structure may be comprised of a two-layered structure comprised of $SiO_2$/AuroraULK (upper layer/lower layer), wherein the $SiO_2$ film is used for protecting the AuroraULK film while CMP is carried out to copper. The multi-layered structure may be comprised of a two-layered structure comprised of Black Diamond/AuroraULK (upper layer/lower layer) in order to reduce a capacity between wires. As an alternative, the multi-layered structure may be comprised of a three-layered structure comprised of $SiO_2$/AuroraULK/$SiO_2$ (upper layer/intermediate layer/lower layer), wherein the upper $SiO_2$ layer is used for protecting the AuroraULK film while CMP is carried out to copper, and the lower $SiO_2$ layer is used as an adhesive layer.

Then, as illustrated in FIG. 18B, there is formed the first barrier metal film 4a in accordance with a sputtering process. The first barrier metal film 4a has a multi-layered structure comprised of Ta/TaN (upper layer/lower layer), and covers therewith an exposed surface of the first interlayer insulating film 10a and a sidewall and a bottom (an exposed surface of the interlayer insulating film 2) of the wire trench 11a.

As illustrated in FIG. 18C, the copper alloy seed film 12 is formed on the first barrier metal film 4a.

The copper alloy seed film 12 is composed of copper/aluminum alloy fabricated by an ionized sputtering process through the use of a copper/aluminum alloy target comprised of a copper target containing aluminum at 1.2 at. %.

Then, a copper film 13 is formed over the copper alloy seed film 12 in accordance with an electrolytic plating process in which the copper alloy seed film 12 is used as an electrode.

Then, aluminum is thermally dispersed into the copper film 13 from the copper alloy seed film 12 composed of copper/aluminum alloy, by carrying out thermal annealing at 350 degrees centigrade for 30 minutes. As a result, as illustrated in FIG. 18D, an alloy film 14 composed of copper/aluminum alloy is formed on the first barrier metal film 4a.

Aluminum contained in the copper alloy seed film 12 is non-uniformly dispersed, resulting in that an aluminum concentration of the alloy film 14 is higher at an area closer to the first barrier metal film 4a.

The aluminum concentration is highest in the vicinity of the first barrier metal film 4a, but even the highest aluminum concentration is equal to or smaller than 1.0 at. %.

Then, as illustrated in FIG. 18E, the alloy film 14 is removed by CMP (Chemical Mechanical Polishing) until the first interlayer insulating film 10a appears. Thus, there is formed the first alloy wire 5a.

Then, the first alloy wire 5a is covered at an upper surface thereof with the first wire-protection film 6a composed of SiCN containing aluminum and fabricated in accordance with plasma CVD.

An amount of aluminum to be contained in the first wire-protection film 6a is determined such that a concentration of the metal element contained in the first wire-protection film 6a covering an upper surface of the first alloy wire 5a therewith is equal to or smaller than 1 at. %.

Aluminum contained in the first alloy wire 5a is demixed by the thermal annealing having been carried out for forming the first wire-protection film 6a, at an interface between the first wire-protection film 6a and the first alloy wire 5a, resulting in that a concentration of aluminum in the vicinity of the interface is higher than a concentration of aluminum inside of the first alloy wire 5a.

Then, the via interlayer insulating film 7 composed of $SiO_2$, the second etching-stopper film 3b composed of SiCN, and the second interlayer insulating film 10b composed of $SiO_2$ are formed in this order on upper surfaces of the first wire-protection films 6a and 15a.

The second interlayer insulating film 10b has the same structure as that of the first interlayer insulating film 10a.

The via interlayer insulating film 7 may be comprised of, for instance, a $SiO_2$ film, a SiC film, a SiCN film, a HSQ (HydrogenSilsesquioxane) film (for instance, Type 12 (Registered Trademark)), a MSQ (MethylSilsesquioxane) film (for instance, a JSR-LKD (Registered Trademark) film, an ALCAP (Registered Trademark) film, an NCS (Registered Trademark) film, an IPS (Registered Trademark) film or a HOSP (Registered Trademark) film), an organic polymer film (for instance, a SiLK (Registered Trademark) film or a Flare (Registered Trademark) film), a SiOCH film, a SiOC film (for instance, a Black Diamond (Registered Trademark) film, a CORAL (Registered Trademark) film, an AuroraULK (Registered Trademark) film, or an Orion (Registered Trademark) film), an electrically insulating thin film comprised of the above-mentioned films to which organic material is added, a film having a multi-layered structure comprised of a plurality of any one of the above-mentioned films, or any one of the above-mentioned films having a composition and/or a density varying in a depth-wise direction.

Then, as illustrated in FIG. 18G, there are formed a via-hole 11c passing through the second interlayer insulating film 10b, the second etching-stopper film 3b, the via interlayer insulating film 7 and the first wire-protection film 6a, and a wire trench 11b passing through the second interlayer insulating film 10b, in accordance with a dual damascene process. The wire trench 11b is larger in diameter than the via-hole 11c.

Then, as illustrated in FIG. 18H, the second barrier metal film 4b having a multi-layered structure comprised of Ta/TaN (upper layer/lower layer) is formed in accordance with a sputtering process so as to cover the via-hole 11c and the wire trench 11b therewith.

Then, similarly to the first alloy wire 5a formed in the wire trench 11a, the second alloy wire 5b is formed in the via-hole 11c and the wire trench 11b.

Then, the second alloy wire 5b and the second interlayer insulating film 10b are covered at upper surfaces thereof with the second wire-protection film 6b composed of SiCN containing aluminum and fabricated in accordance with plasma CVD.

An amount of aluminum to be contained in the second wire-protection film 6b is determined such that a concentration of the metal element contained in the second wire-protection film 6b covering an upper surface of the second alloy wire 5b therewith is equal to or smaller than 1 at. %.

Similarly to the first alloy wire 5a, a concentration of aluminum contained in the second alloy wire 5b is higher at a location closer to the second barrier metal film 4b.

Furthermore, a concentration of aluminum in the vicinity of an interface between the second wire-protection film 6b and the second alloy wire 5b is higher than a concentration of aluminum inside of the second alloy wire 5b.

A concentration of aluminum contained in the second alloy wire 5b is highest in the vicinity of the second barrier metal film 4b, but even the highest aluminum concentration is equal to or smaller than 1.0 at. %.

The semiconductor device fabricated in accordance with the above-mentioned steps makes it possible to enhance adhesion between the first and second alloy wires 5a, 5b and the first and second wire-protection films 6a, 6b, respectively, ensuring enhancement in a resistance to both electromigration and stress-inducing voids.

(Nineteenth Embodiment)

Figure 19A:
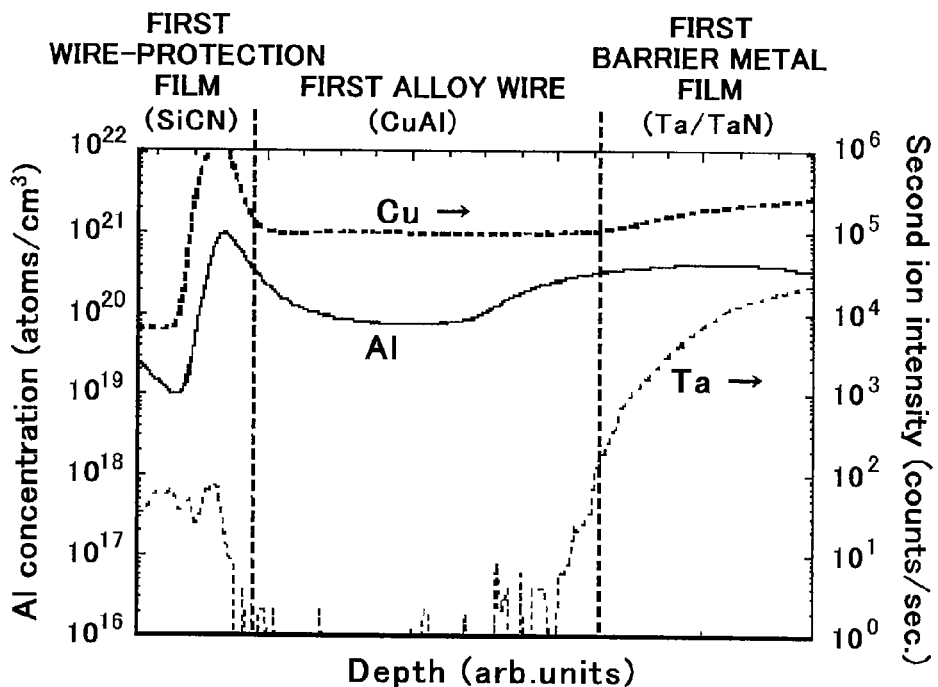
FIG. 19A is a graph showing a profile of an aluminum concentration in a depth-wise direction in a semiconductor device fabricated in accordance with the method of the fifth embodiment.
Figure 19B:
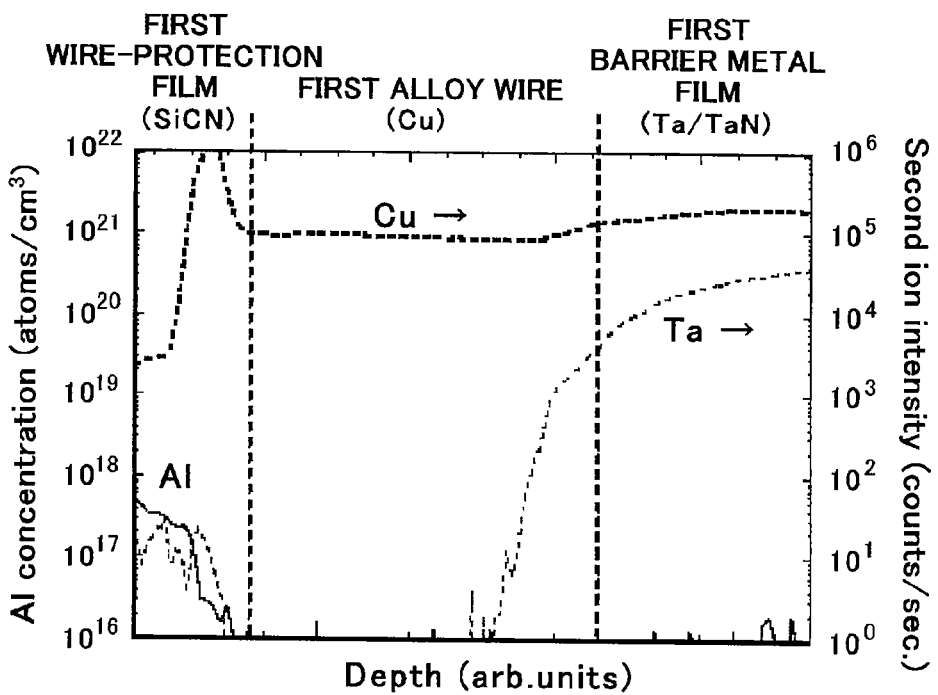
FIG. 19B is a graph showing a profile of an aluminum concentration in the semiconductor device to which aluminum is not added.

FIG. 19A is a graph showing a profile of an aluminum concentration in a depth-wise direction in the first barrier metal film 4a, the first alloy wire 5a and the first wire-protection film 6a in the semiconductor device (FIG. 7I) fabricated in accordance with the method of the fifth embodiment, and FIG. 19B is a graph showing a profile of an aluminum concentration in the semiconductor device to which aluminum is not added.

Figure 20A:
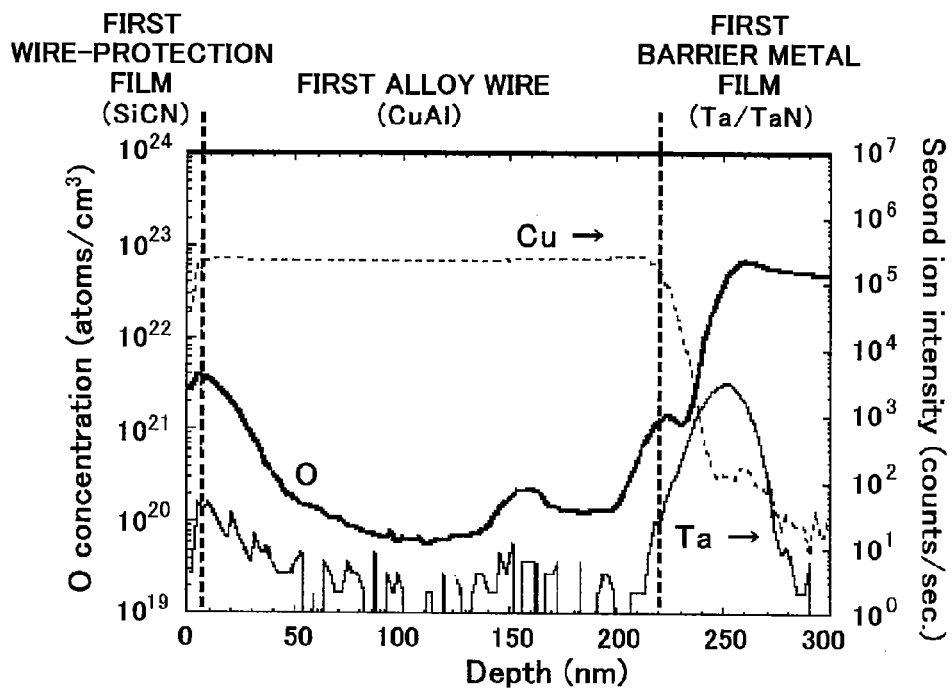
FIG. 20A is a graph showing a profile of an oxygen concentration in a depth-wise direction in a semiconductor device fabricated in accordance with the method of the fifth embodiment.
Figure 20B:
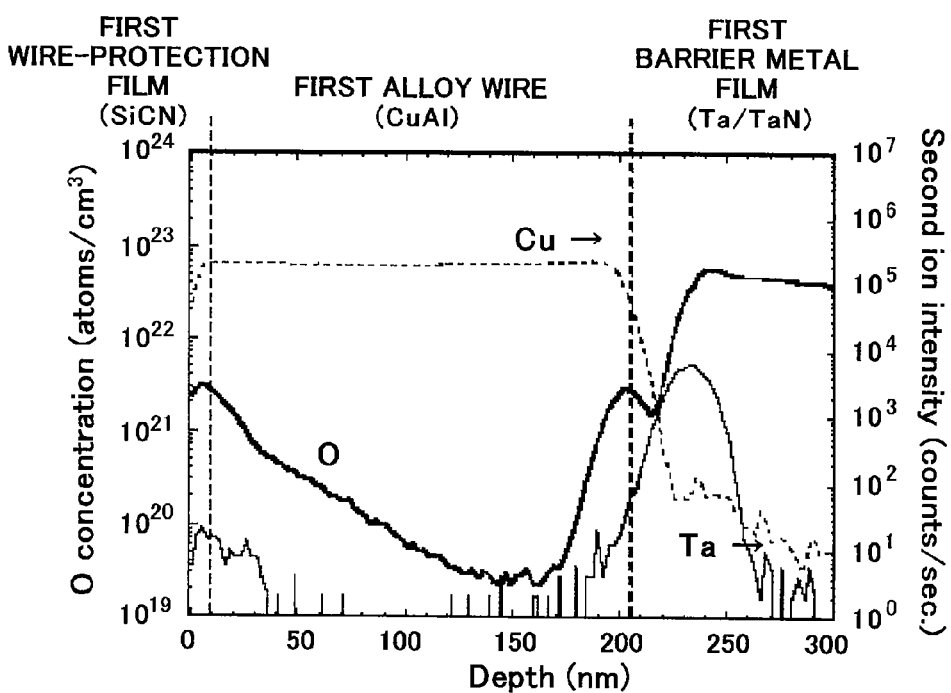
FIG. 20B is a graph showing a profile of an oxygen concentration found when an aluminum concentration in the first alloy wire has no dependence on a depth.

FIG. 20A is a graph showing a profile of an oxygen concentration in a depth-wise direction in the first barrier metal film 4a, the first alloy wire 5a and the first wire-protection film 6a in the semiconductor device (FIG. 7I) fabricated in accordance with the method of the fifth embodiment, and FIG. 20B is a graph showing a profile of an oxygen concentration found when an aluminum concentration in the first alloy wire 5a is not dependent on a depth.

As illustrated in FIG. 19A, by controlling an aluminum concentration such that the aluminum concentration is high at a portion of the first alloy wire 5a close to the first barrier metal film 4a and at a surface of the first alloy wire 5a, the semiconductor device could have a higher resistance to electromigration and stress-inducing voids than a resistance of an alloy wire to which aluminum having almost the same resistance is uniformly added.

The aluminum concentration shown in FIGS. 19A and 19B is determined in the first alloy wire 5a (CuAl film) by means of SIMS analysis carried out through a surface of the first wire-protection film 6a (SiCN film).

The interface between the first wire-protection film 6a and the first alloy wire 5a is influenced by the matrix effect, but indicates that Cu and Al exist in the first wire-protection film 6a (SiCN film).

This is obvious by comparing to the aluminum concentration profile obtained when aluminum is not added, shown in FIG. 19B.

It is further confirmed that reliability can be further enhanced by adding silicon to a surface of the first alloy wire 5a before the formation of the first wire-protection film 6a (SiCN film).

It is preferable that silicon is added into an area located in the vicinity of the first wire-protection film 6a (SiCN film). This is because the advantages obtained by controlling the aluminum concentration to be high in the vicinity of the first barrier metal film 4a and in the vicinity of a surface of the first alloy wire 5a are maintained.

The aluminum concentration profile can be controlled by using an alloy seed as shown in the fifth embodiment, by precipitating aluminum at a surface (interface) by carrying out thermal annealing, based on the fact that aluminum has a larger atomic radius than that of copper, and is attracted to a tensile stress field such as a grain boundary or a surface, or by dispersing aluminum through a surface of the first alloy wire 5a, for instance.

The reason why the reliability of the semiconductor device fabricated in accordance with the method indicated as the fifth embodiment is that adhesion between the first alloy wire 5a and the first wire-protection film 6a is enhanced, and further, a surface of the first barrier metal film 4a is suppressed from being oxidized, and hence, adhesion between the first alloy wire 5a and the first barrier metal film 4a is also enhanced.

This is because, as illustrated in FIG. 20A, that is, the oxygen concentration profile in the depth-wise direction, the oxygen concentration has a peak in the first alloy wire 5a (CuAl film), and hence, a stable oxide film (since a signal intensity of copper does not vary in the area in which the oxygen concentration has a peak, the oxide film is considered to be quite thin) is formed at a surface of the alloy seed film 12 due to oxidation of aluminum in the step illustrated in FIG. 7C, that is, the step of forming the alloy seed film 12, resulting in that a surface of the first barrier metal film 4a is suppressed from being oxidized.

In comparison with FIG. 20B showing the oxygen concentration profile obtained when the aluminum concentration in the first alloy wire 4a is not dependent on the depth, the oxygen concentration has a smaller peak at a surface of the first barrier metal film 4a in FIG. 20A.

(Twentieth Embodiment)

FIGS. 21A to 21I are cross-sectional views of a semiconductor device including a wire-protection film containing no metals, but providing enhanced reliability by virtue of controlled concentration profile of an alloy wire, each illustrating a step of the method of fabricating the semiconductor device. Hereinbelow is explained the method of fabricating the semiconductor device with reference to FIGS. 21A to 21I.

Figure 21A:
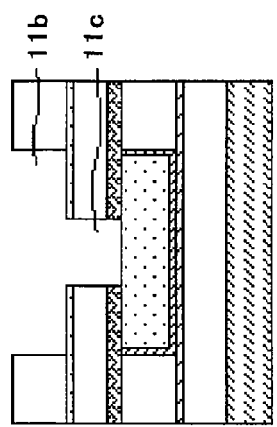
FIGS. 21A to 21I are cross-sectional views of a semiconductor device including a wire-protection film containing no metals, but providing enhanced reliability by virtue of controlled concentration profile of an alloy wire, each illustrating a step in the method of fabricating the semiconductor device.

First, as illustrated in FIG. 21A, an interlayer insulating film 2 composed of $SiO_2$, a first etching-stopper film 3a composed of SiCN, and a first interlayer insulating film 10a composed of $SiO_2$ are formed in this order on a semiconductor substrate 1 on which a semiconductor element (not illustrated) is formed.

Then, a wire trench 11a is formed in the first interlayer insulating film 10a in accordance with a damascene process.

The first interlayer insulating film 10a may be comprised of, for instance, a $SiO_2$ film, a SiC film, a SiCN film, a HSQ (HydrogenSilsesquioxane) film (for instance, Type 12 (Registered Trademark)), a MSQ (MethylSilsesquioxane) film (for instance, a JSR-LKD (Registered Trademark) film, an ALCAP (Registered Trademark) film, an NCS (Registered Trademark) film, an EPS (Registered Trademark) film or a HOSP (Registered Trademark) film), an organic polymer film (for instance, a SiLK (Registered Trademark) film or a Flare (Registered Trademark) film), a SiOCH film, a SiOC film (for instance, a Black Diamond (Registered Trademark) film, a CORAL (Registered Trademark) film, an AuroraULK (Registered Trademark) film, or an Orion (Registered Trademark) film), an electrically insulating thin film comprised of the above-mentioned films to which organic material is added, a film having a multi-layered structure comprised of a plurality of any one of the above-mentioned films, or any one of the above-mentioned films having a composition and/or a density varying in a depth-wise direction.

The multi-layered structure may be comprised of a two-layered structure comprised of $SiO_2$/AuroraULK (upper layer/lower layer), wherein the $SiO_2$ film is used for protecting the AuroraULK film while CMP is carried out to copper. The multi-layered structure may be comprised of a two-layered structure comprised of Black Diamond/AuroraULK (upper layer/lower layer) in order to reduce a capacity between wires. As an alternative, the multi-layered structure may be comprised of a three-layered structure comprised of $SiO_2$/AuroraULK/$SiO_2$ (upper layer/intermediate layer/lower layer), wherein the upper $SiO_2$ layer is used for protecting the AuroraULK film while CMP is carried out to copper, and the lower $SiO_2$ layer is used as an adhesive layer.

Figure 21B:
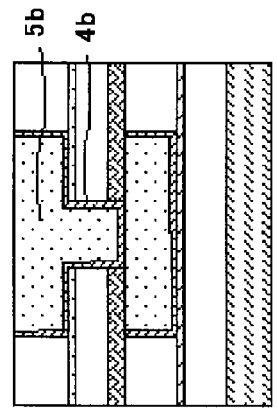

Then, as illustrated in FIG. 21B, there is formed the first barrier metal film 4a in accordance with a sputtering process. The first barrier metal film 4a has a multi-layered structure comprised of Ta/TaN (upper layer/lower layer), and covers therewith an exposed surface of the first interlayer insulating film 10a and a sidewall and a bottom (an exposed surface of the interlayer insulating film 2) of the wire trench 11a.

Figure 21C:
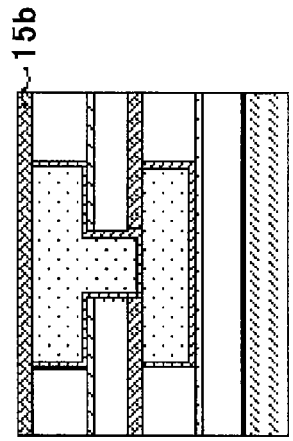

As illustrated in FIG. 21C, the copper alloy seed film 12 is formed on the first barrier metal film 4a.

The copper alloy seed film 12 is composed of copper/aluminum alloy fabricated by an ionized sputtering process through the use of a copper/aluminum alloy target comprised of a copper target containing aluminum at 1.2 at. %.

Then, a copper film 13 is formed over the copper alloy seed film 12 in accordance with an electrolytic plating process in which the copper alloy seed film 12 is used as an electrode.

Then, the product is thermally annealed at 200 degrees centigrade for 30 minutes to thereby unify the copper alloy seed film 12 composed of copper/aluminum alloy, and the copper film 13 together.

Figure 21D:
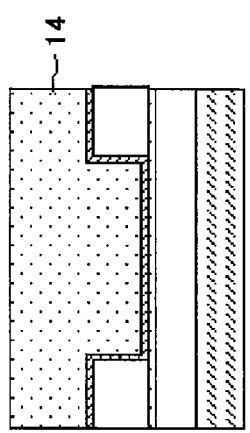

Then, as illustrated in FIG. 21D, an alloy film 14 composed of copper/aluminum alloy is formed on the first barrier metal film 4a. The thermal annealing carried out at this stage is for preventing defectiveness and peeling from being generated when CMP for planarization is carried out later.

Figure 21E:
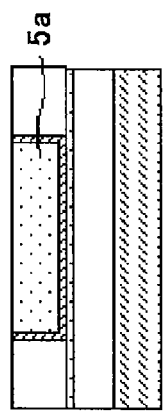

Then, as illustrated in FIG. 21E, the alloy film 14 is removed by CMP (Chemical Mechanical Polishing) until the first interlayer insulating film 10a appears. Thus, there is formed the first alloy wire 5a.

Then, the product is thermally annealed at 350 degrees centigrade for 30 minutes to thereby disperse a part of aluminum contained at a relatively high concentration in the vicinity of the first barrier metal film 4a in the first alloy wire 5a composed of copper/aluminum alloy, into the first alloy wire 5a, and then, precipitate at a surface. As a result, an aluminum concentration at surfaces of the first barrier metal film 4a and the first alloy wire 5a is higher than an aluminum concentration in a central area of the first alloy wire 5a.

Figure 21F:
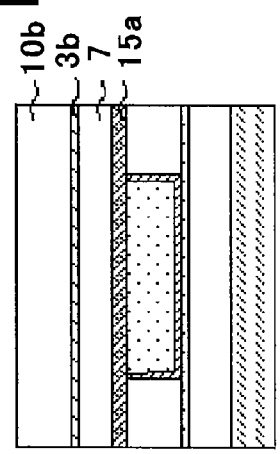

Then, as illustrated in FIG. 21F, the first alloy wire 5a is covered at an upper surface thereof with the first wire-protection film 15a composed of SiCN.

Then, the via interlayer insulating film 7 composed of $SiO_2$, the second etching-stopper film 3b composed of SiCN, and the second interlayer insulating film 10b composed of $SiO_2$ are formed in this order on an upper surface of the first wire-protection film 15a.

A concentration of aluminum contained in the first alloy wire 5a is higher at a location closer to the first barrier metal film 4a.

A concentration of aluminum in the vicinity of an interface between the first wire-protection film 15a and the first alloy wire 5a is higher than a concentration of aluminum in the first alloy wire 5a.

The aluminum concentration of the first alloy wire 5a is highest in the vicinity of the first barrier metal film 4a, but even the highest aluminum concentration is equal to or smaller than 1.0 at. %.

The second interlayer insulating film 10b has the same structure as that of the first interlayer insulating film 10a.

The via interlayer insulating film 7 may be comprised of, for instance, a $SiO_2$ film, a SiC film, a SiCN film, a HSQ (HydrogenSilsesquioxane) film (for instance, Type 12 (Registered Trademark)), a MSQ (MethylSilsesquioxane) film (for instance, a JSR-LKD (Registered Trademark) film, an ALCAP (Registered Trademark) film, an NCS (Registered Trademark) film, an IPS (Registered Trademark) film or a HOSP (Registered Trademark) film), an organic polymer film (for instance, a SiLK (Registered Trademark) film or a Flare (Registered Trademark) film), a SiOCH film, a SiOC film (for instance, a Black Diamond (Registered Trademark) film, a CORAL (Registered Trademark) film, an AuroraULK (Registered Trademark) film, or an Orion (Registered Trademark) film), an electrically insulating thin film comprised of the above-mentioned films to which organic material is added, a film having a multi-layered structure comprised of a plurality of any one of the above-mentioned films, or any one of the above-mentioned films having a composition and/or a density varying in a depth-wise direction.

Figure 21G:
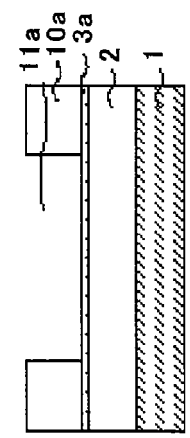

Then, as illustrated in FIG. 21G, there are formed a via-hole 11c passing through the second interlayer insulating film 10b, the second etching-stopper film 3b, the via interlayer insulating film 7 and the first wire-protection film 15a, and a wire trench 11b passing through the second interlayer insulating film 10b, in accordance with a dual damascene process. The wire trench 11b is larger in diameter than the via-hole 11c.

Figure 21H:
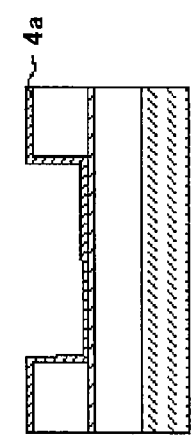

Then, as illustrated in FIG. 21H, the second barrier metal film 4b having a multi-layered structure comprised of Ta/TaN (upper layer/lower layer) is formed in accordance with a sputtering process so as to cover the via-hole 11c and the wire trench 11b therewith.

Then, the second alloy wire 5b is formed in the via-hole 11c and the wire trench 11b. The steps of forming the second alloy wire 5b are identical with the steps of forming the first alloy wire 5a in the wire trench 11a.

Then, a part of aluminum contained at a relatively high concentration in the vicinity of the second barrier metal film 4b in the second alloy wire 5b, and is precipitated at a surface, by carrying out thermal annealing at 350 degrees centigrade for 30 minutes. As a result, a concentration of aluminum at surfaces of the second barrier metal film 4a and the second alloy wire 5b is higher than a concentration of aluminum in a central area of the second alloy wire 5b.

Figure 21I:
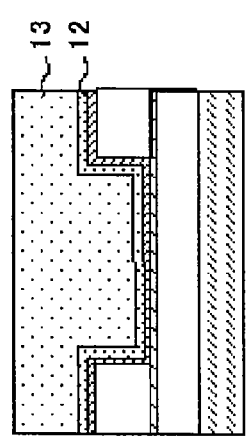
Figure 22A:
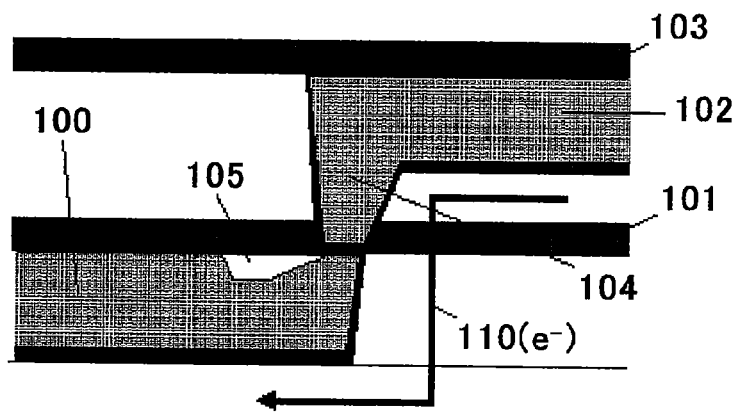
FIG. 22A is a cross-sectional view of a wire in which defectiveness is generated due to electromigration.
Figure 22B:
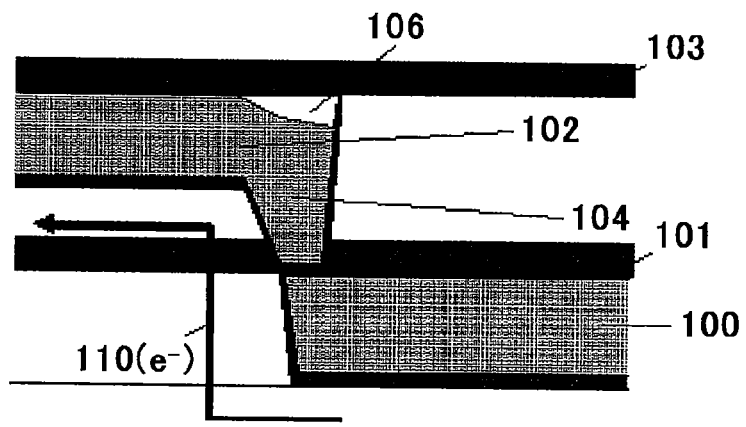
FIG. 22B is a cross-sectional view of a wire in which defectiveness is generated due to electromigration.
Figure 23:
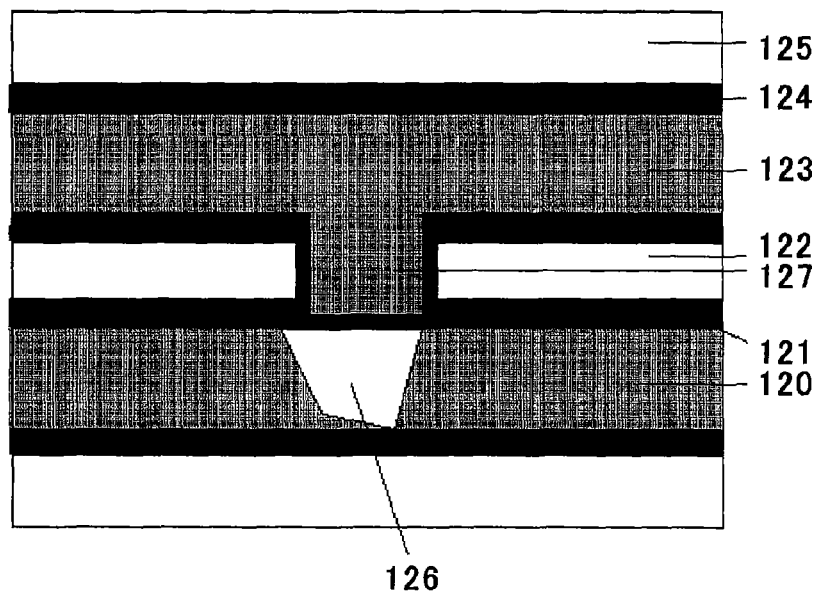
FIG. 23 is a cross-sectional view of a damascene wire in which a stress-inducing void is generated.

Then, as illustrated in FIG. 21I, the second alloy wire 5b and the second interlayer insulating film 10b are covered at upper surfaces thereof with the second wire-protection film 15b composed of SiCN.

Similarly to the first alloy wire 5a, a concentration of aluminum contained in the second alloy wire 5b is higher at a location closer to the second barrier metal film 4b.

Furthermore, a concentration of aluminum in the vicinity of an interface between the second wire-protection film 15b and the second alloy wire 5b is higher than a concentration of aluminum inside of the second alloy wire 5b.

A concentration of aluminum contained in the second alloy wire 5b is highest in the vicinity of the second barrier metal film 4b, but even the highest aluminum concentration is equal to or smaller than 1.0 at. %.

The semiconductor device fabricated in accordance with the above-mentioned steps makes it possible to enhance adhesion between the first and second alloy wires 5a, 5b and the first and second wire-protection films 15a, 15b, respectively, and further, enhance adhesion between the first and second alloy wires 5a, 5b and the first and second barrier metal films 4a and 4b, ensuring enhancement in a resistance to both electromigration and stress-inducing voids.

Furthermore, since an aluminum concentration in the vicinity of central areas of the first and second alloy wires 5a and 5b is low, it is possible not only to enhance reliability, but also to suppress an increase in a resistance of the first and second alloy wires 5a and 5b.

It is possible to further enhance reliability by causing the first and second wire-protection films 15a and 15b to contain the metal element contained in the first and second alloy wires 5a and 5b after the first and second alloy wires 5a and 5b were formed.

The present invention is applicable to any multi-layered wire structure and a method of fabricating the same, if the wire structure includes a wire composed of copper alloy containing copper as a principal constituent.

While the present invention has been described in connection with certain preferred embodiments, it is to be understood that the embodiments are merely examples for explaining the present invention, and the subject matter encompassed by way of the present invention is not to be limited to those specific embodiments.

For instance, the present invention has been described in connection with a semiconductor device including a CMOS circuit, but the present invention is not to be limited to the semiconductor device. The present invention can be applied, for instance, to a semiconductor device including a memory circuit such as DRAM (Dynamic Random Access Memory), SRAM (Static Random Access Memory), a flush memory, FRAM (Ferro Electric Random Access Memory), MRAM (Magnetic Random Access Memory), and a memory having a variable resistance, a semiconductor device including a logic circuit such as a microprocessor, or a semiconductor device including both a memory circuit and a logic circuit.

Furthermore, the present invention can be applied to a semiconductor device having a structure at least partially including a buried alloy wire therein, an electronic circuit device, an optical circuit device, a quantum circuit device or a micro-machine.

The invention claimed is:

1. A semiconductor device including a wire composed of alloy, and a first wire-protection film covering an upper surface of said alloy wire therewith,
    wherein said first wire-protection film contains at least aluminum
    said first wire-protection film is comprised of one of a SiN film, a SiC film, a SiCN film, a SiOC film, a SiOCH film, a SiN film containing organic material, a SiC film containing organic material, a SiCN film containing organic material, a SiOC film containing organic material, a SiOCH film containing organic material, a SiN film containing organic material as a principal constituent, a SiC film containing organic material as a principal constituent, a SiCN film containing organic material as a principal constituent, a SiOC film containing organic material as a principal constituent, a SiOCH film containing organic material as a principal constituent, a SiN film containing organic material as a principal constituent and further containing SiO, a SiC film containing organic material as a principal constituent and further containing SiO, a SiCN film containing organic material as a principal constituent and further containing SiO, a SiOC film containing organic material as a principal constituent and further containing SiO, and a SiOCH film containing organic material as a principal constituent and further containing SiO,
    said alloy wire contains at least one of aluminum,
    a concentration of aluminum in said alloy wire is smaller than 0.1 at.% in a central area of said alloy wire, and equal to or greater than 0.1 at.%, and equal to or smaller than 1.5 at.% in a vicinity of said first wire-protection film,
    the central area of said alloy wire is defined as an area extending from a center of said alloy wire in a heightwise direction of said alloy wire by 10% of a height of said alloy wire, and further extending from the center of said alloy wire in a width-wise direction of said alloy wire by 10% of a width of said alloy wire, and
    the vicinity of said first wire-protection film is defined as an area extending from said first wire-protection film by 10% of the height of said alloy wire.

2. The semiconductor device as set forth in claim 1, wherein said alloy wire contains copper as a principal constituent.

3. The semiconductor device as set forth in claim 1, further comprising a barrier metal film covering said alloy wire therewith, wherein a concentration of aluminum in said alloy wire is higher in the vicinity of both said first wire-protection film and said barrier metal film than in the central area of said alloy wire.

4. The semiconductor device as set forth in claim 3, wherein a concentration, of aluminum in said alloy wire is smaller than 0.1 at.% in the central area of said alloy wire, and equal to or greater than 0.1 at.%, but equal to or smaller than 1.5 at.% in the vicinity of both said first wire-protection film and said barrier metal film.

5. The semiconductor device as set forth in claim 3, wherein said alloy wire is comprised of a copper/aluminum alloy wire containing copper as a principal constituent, and further containing aluminum, and a concentration of aluminum in said alloy wire is smaller than 0.1 at.% in the central area of said alloy wire, and equal to or greater than 0.1 at.%, but equal to or smaller than 1.5 at.% in said alloy wire at the vicinity of both said first wire-protection film and said barrier metal film.

6. The semiconductor device as set forth in claim 1, wherein aluminum in said first wire-protection film has a higher concentration at a location closer to said alloy wire in comparison to an upper surface of said first wire-protection film.

7. The semiconductor device as set forth in claim 1, wherein said alloy wire is comprised of a copper/aluminum alloy wire containing copper as a principal constituent, and further containing aluminum, and said first wire-protection film is comprised of a SiCN film containing copper and aluminum.

8. A semiconductor device including a wire composed of alloy, and a first wire-protection film covering an upper surface of said alloy wire therewith,
    wherein said first wire-protection film contains at least aluminum; a concentration, in said alloy wire, of metal elements other than a principal constituent of said alloy wire is higher in the vicinity of said first wire-protection film than in a central area of said alloy wire, and said alloy wire contains at least aluminum, and
    wherein said first wire-protection film is comprised of one of a SiN film, a SiC film, a SiCN film, a SiOC film, a SiOCH film, a SiN film containing organic material, a SiC film containing organic material, a SiCN film containing organic material, a SiOC film containing organic material, a SiOCH film containing organic material, a SiN film containing organic material as a principal constituent, a SiC film containing organic material as a principal constituent, a SiCN film containing organic material as a principal constituent, a SiOC film containing organic material as a principal constituent, a SiOCH film containing organic material as a principal constituent, a SiN film containing organic material as a principal constituent and further containing SiO, a SiC film containing organic material as a principal constituent and further containing SiO, a SiCN film containing organic material as a principal constituent and further containing SiO, a SiOC film containing organic material as a principal constituent and further containing SiO, and a SiOCH film containing organic material as a principal constituent and further containing SiO, a concentration of aluminum in said alloy wire is smaller than 0.1 at.% in the central area of said alloy wire, and equal to or greater than 0.1 at.%, and equal to or smaller than 1.5 at.% in the vicinity of said first wire-protection film, the central area of said alloy wire is defined as an area extending from a center of said alloy wire in a height-wise direction of said alloy wire by 10% of a height of said alloy wire, and further extending from the center of said alloy wire in a width-wise direction of said alloy wire by 10% of a width of said alloy wire, and the vicinity of said first wire-protection film is defined as an area extending from said first wire-protection film by 10% of the height of said alloy wire.

9. The semiconductor device as set forth in claim 8, further comprising a second wire-protection film formed on said first wire-protection film, wherein said second wire-protection film does not contain aluminum.

10. The semiconductor device as set forth in claim 9, wherein said second wire-protection film is comprised of an electrically insulating film.

11. The semiconductor device as set forth in claim 8, wherein said alloy wire contains copper as the principal constituent.

12. The semiconductor device as set forth in claim 8, further comprising a barrier metal film covering said alloy wire therewith, wherein a concentration of aluminum in said alloy wire is higher in the vicinity of both said first wire-protection film and said barrier metal film than in the central area of said alloy wire.

13. The semiconductor device as set forth in claim 12, wherein a concentration, of aluminum in said alloy wire is smaller than 0.1 at.% in the central area of said alloy wire, and equal to or greater than 0.1 at.% but equal to or smaller than 1.5 at.% in the vicinity of both said first wire-protection film and said barrier metal film.

14. The semiconductor device as set forth in claim 12, wherein said alloy wire is comprised of a copper/aluminum alloy wire containing copper as the principal constituent, and further containing aluminum, and a concentration of aluminum in said alloy wire is smaller than 0.1 at.% in the central area of said alloy wire, and equal to or greater than 0.1 at.% but equal to or smaller than 1.5 at.% in said alloy wire at the vicinity of both said first wire-protection film and said barrier metal film.

15. The semiconductor device as set forth in claim 8, wherein aluminum in said first wire-protection film has a higher concentration at a location closer to said alloy wire in comparison to an upper surface of said first wire-protection film.

16. The semiconductor device as set forth in claim 5, wherein said alloy wire is comprised of a copper/aluminum alloy wire containing copper as the principal constituent, and further containing aluminum, and said first wire-protection film is comprised of a SiCN film containing copper and aluminum.

* * * * *